US012178069B2

(12) United States Patent
Kato

(10) Patent No.: US 12,178,069 B2
(45) Date of Patent: Dec. 24, 2024

(54) DISPLAY DEVICE AND MANUFACTURING METHOD OF THE DISPLAY DEVICE

(71) Applicant: Japan Display Inc., Tokyo (JP)

(72) Inventor: Daisuke Kato, Tokyo (JP)

(73) Assignee: Japan Display Inc., Tokyo (JP)

(*) Notice: Subject to any disclaimer, the term of this patent is extended or adjusted under 35 U.S.C. 154(b) by 640 days.

(21) Appl. No.: 17/474,749

(22) Filed: Sep. 14, 2021

(65) Prior Publication Data

US 2021/0408480 A1 Dec. 30, 2021

Related U.S. Application Data

(63) Continuation of application No. PCT/JP2020/004110, filed on Feb. 4, 2020.

(30) Foreign Application Priority Data

Mar. 22, 2019 (JP) ................. 2019-054990

(51) Int. Cl.
*H10K 50/844* (2023.01)
*G09F 9/00* (2006.01)
*G09F 9/30* (2006.01)
*H10K 59/12* (2023.01)
*H10K 59/124* (2023.01)
(Continued)

(52) U.S. Cl.
CPC ......... *H10K 50/844* (2023.02); *H10K 59/124* (2023.02); *H10K 71/00* (2023.02); *H10K 59/1201* (2023.02)

(58) Field of Classification Search
CPC .......... G09F 9/00; G09F 9/30; H10K 59/124; H10K 59/873; H10K 50/844
See application file for complete search history.

(56) References Cited

U.S. PATENT DOCUMENTS

2017/0077456 A1    3/2017  Chung et al.
2017/0244063 A1*   8/2017  Furuie ................. H10K 50/844
(Continued)

FOREIGN PATENT DOCUMENTS

JP    2012-3989 A    1/2012
JP    2017-147165 A  8/2017
(Continued)

OTHER PUBLICATIONS

Office Action issued on Jan. 17, 2023, in corresponding Japanese Application No. 2019-054990, 12 pages.
(Continued)

*Primary Examiner* — Antonio B Crite
(74) *Attorney, Agent, or Firm* — Maier & Maier, PLLC

(57) ABSTRACT

A display device including a substrate, a transistor, a leveling film, a display element, a dam, and a guide. The substrate has a display region and a periphery region surrounding the display region. The transistor is located over the display region. The leveling film is located over and covers the transistor. The display element is located over the leveling film and is electrically connected to the transistor. The dam is located over the peripheral region and surrounds the display region. The guide is located between the leveling film and the dam and surrounds the display region. The guide includes a first organic compound included in the leveling film.

15 Claims, 27 Drawing Sheets

(51) Int. Cl.
 *H10K 59/80* (2023.01)
 *H10K 71/00* (2023.01)

(56) References Cited

U.S. PATENT DOCUMENTS

2019/0312228 A1    10/2019  Sonoda et al.
2020/0020880 A1*    1/2020  Saida ................. H10K 50/8426

FOREIGN PATENT DOCUMENTS

JP   WO 2019/012680 A1    1/2019
WO   WO 2018/179035 A1    10/2018

OTHER PUBLICATIONS

International Search Report issued Mar. 17, 2020 in PCT/JP2020/004110, filed on Feb. 4, 2020, 2 pages.

* cited by examiner

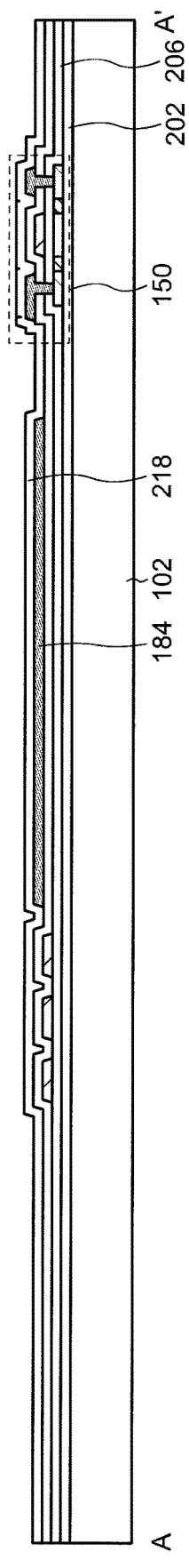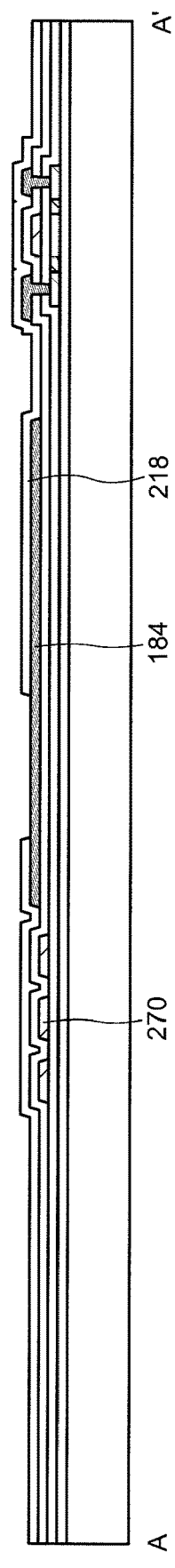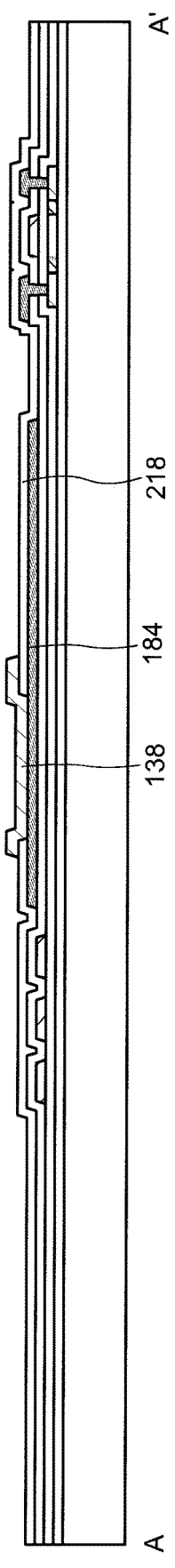

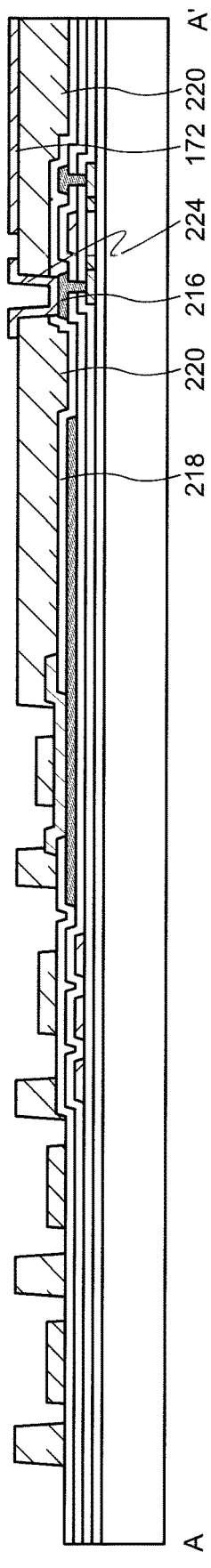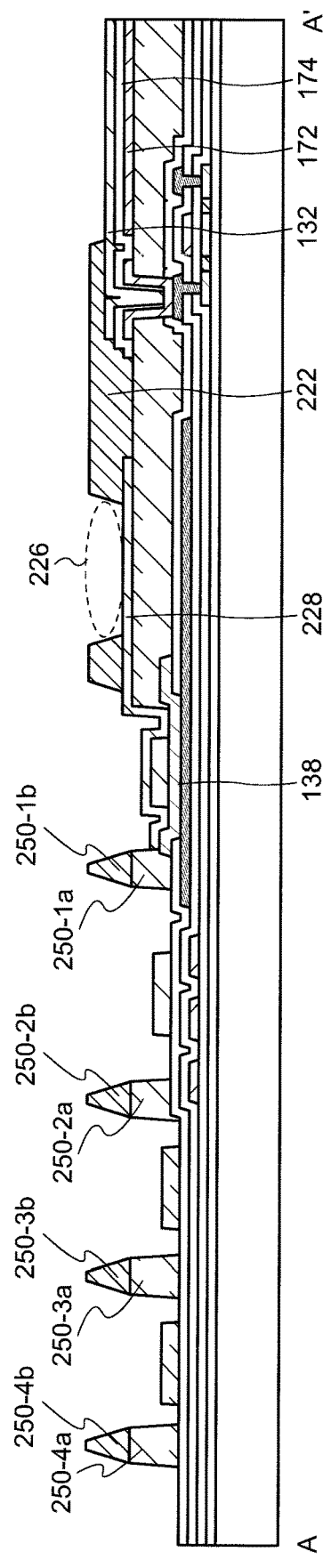

DISPLAY DEVICE AND MANUFACTURING METHOD OF THE DISPLAY DEVICE

CROSS REFERENCE TO RELATED APPLICATIONS

This application is a Continuation of International Patent Application No. PCT/JP2020/004110, filed on Feb. 4, 2020, which claims priority to Japanese Patent Application No. 2019-054990, filed on Mar. 22, 2019, the disclosures of which are incorporated herein by reference for all purposes as if fully set forth herein.

BACKGROUND OF THE INVENTION

An embodiment of the present invention relates to a display device and a manufacturing method of the display device. For example, an embodiment of the present invention relates to a display device having an organic light-emitting element in each pixel and a manufacturing method thereof.

DESCRIPTION OF THE RELATED ART

The organic EL (Electroluminescence) display device has been known as a typical example of display devices. The organic EL display device has an organic light-emitting element (hereinafter, referred to as a light-emitting element) as a display element in each of a plurality of pixels formed over a substrate. The light-emitting element has a layer including organic compounds (hereinafter, referred to as an EL layer) between a pair of electrodes, and is operated by supplying current between the pair of electrodes. The organic compounds are oxidized or reduced to exist in a charged state during operation of the light-emitting element, and recombination thereof results in an excited state. The active species existing in the charged state or the excited state readily react with other organic compounds or impurities such as water and oxygen which have entered the light-emitting element because of their higher reactivity compared with an electrically neutral state or a ground state. Such reactions influence the performance of the light-emitting element, causing a decrease in efficiency and lifetime of the light-emitting element.

The use of a sealing film in which a film including an inorganic compound and a film including an organic compound are stacked has been proposed as a method for suppressing the decrease in performance. It is possible to suppress entrance of impurities and provide a highly reliable display device by forming a sealing film having such a structure over the light-emitting elements (see US Patent Application Publication No. 2017/0077456).

BRIEF SUMMARY OF THE INVENTION

An embodiment of the present invention is a display device. The display device includes a substrate, a transistor, a leveling film, a display element, a dam, and a guide. The substrate has a display region and a periphery region surrounding the display region. The transistor is located over the display region. The leveling film is located over and covers the transistor. The display element is located over the leveling film and is electrically connected to the transistor. The dam is located over the periphery region and surrounds the display region. The guide is located between the leveling film and the dam and surrounds the display region. The guide contains a first organic compound included in the leveling film.

An embodiment of the present invention is a display device. The display device includes a substrate, a transistor, a leveling film, a display element, a first dam, a second dam, and a guide. The substrate has a display region and a periphery region surrounding the display region. The transistor is located over the display region. The leveling film is located over and covers the transistor. The display element is located over the leveling film and is electrically connected to the transistor. The first dam is located over the periphery region and surrounds the display region. The second dam is located over the periphery region and surrounds the first dam. The guide is located at least between the leveling film and the first dam or between the first dam and the second dam. The guide contains a first organic compound included in the leveling film.

An embodiment of the present invention is a manufacturing method of a display device. The manufacturing method includes: forming a transistor over a substrate; forming a first resin so as to cover the transistor; processing the resin to form a leveling film over the transistor, a guide surrounding the leveling film, and a dam surrounding the guide; and forming a display element electrically connected to the transistor. The guide includes a plurality of insulating films formed from the first resin.

BRIEF DESCRIPTION OF THE DRAWINGS

FIG. 23A to FIG. 23C are each a schematic cross-sectional view for explaining a manufacturing method of a display device according to an embodiment of the present invention;

FIG. 25A and FIG. 25B are each a schematic cross-sectional view for explaining a manufacturing method of a display device according to an embodiment of the present invention;

DESCRIPTION OF EMBODIMENTS

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or roles different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, the expression "a structure is exposed from another structure" means a mode in which a part of the structure is not covered by the other structure and includes a mode where the part uncovered by the other structure is further covered by another structure.

First Embodiment

1. Outline Structure

Figure 1:
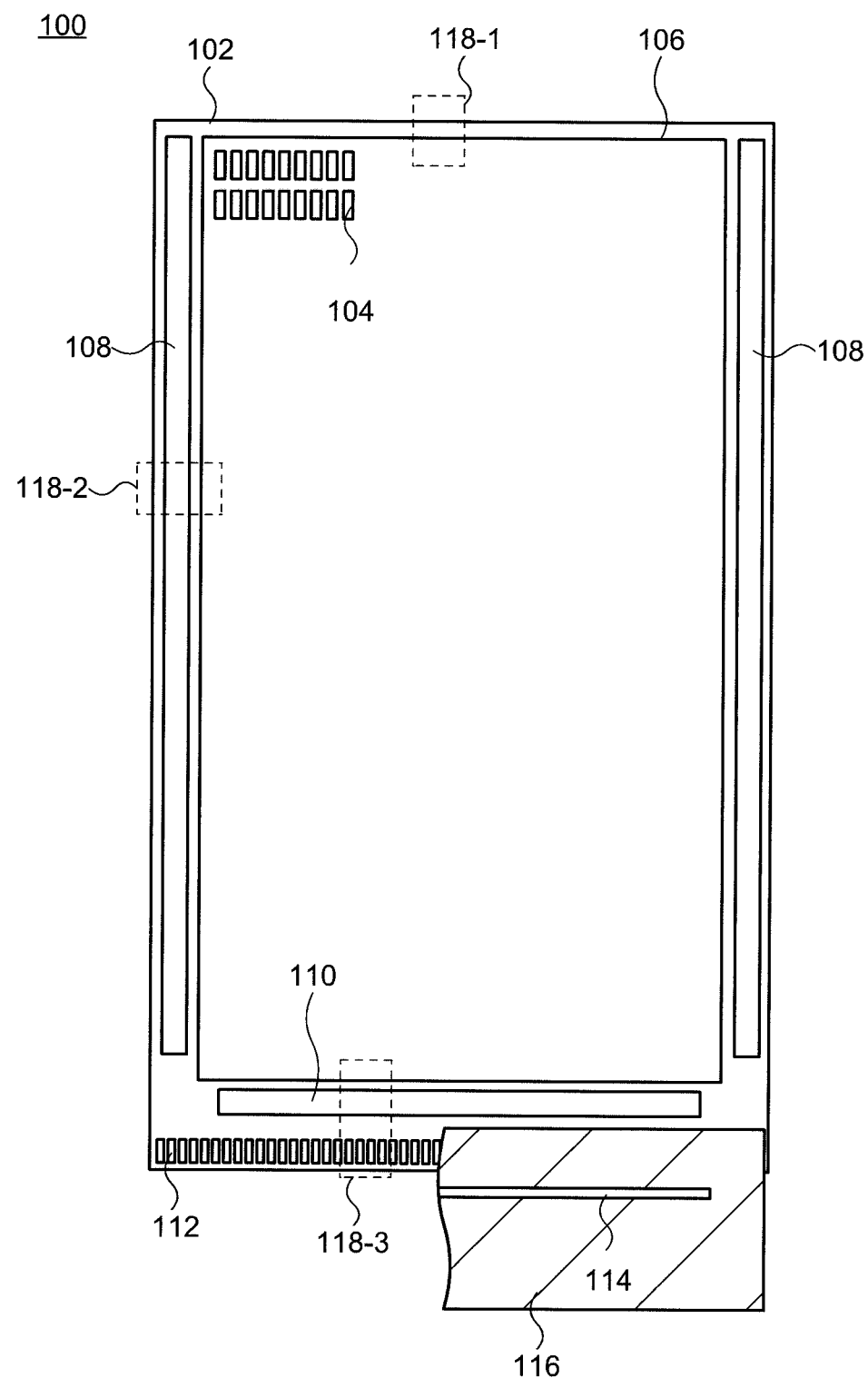
FIG. 1 is a schematic top view of a display device according to an embodiment of the present invention.

A schematic top view of a display device 100 according to an embodiment of the present invention is shown in FIG. 1. As shown in FIG. 1, the display device 100 has a substrate 102 over which a plurality of pixels 104 is disposed. A single region including the plurality of pixels 104 and a region surrounding this region are respectively defined as a display region 106 and a peripheral region of the substrate 102.

Driver circuits for driving the pixels 104 are provided in the peripheral region. In the example shown in FIG. 1, two scanning-line driver circuits 108 sandwiching the display region 106 and a signal-line driver circuit 110 including an analogue switch and the like are provided. Wirings which are not illustrated extend to a side of the substrate 102 from the display region 106, the scanning-line driver circuits 108, and the signal-line driver circuit 110 and are exposed at an edge portion of the substrate 102 to form terminals 112. The terminals 112 are electrically connected to a connector 116 such as a flexible printed circuit (FPC) board. A driver IC 114 for controlling the pixels 104 may be mounted over the connector 116 or the substrate 102. Note that the function of the signal-line driver circuit 110 may be realized by the driver IC 114 without forming the signal-line driver circuit 110 in the peripheral region.

In the following explanation, a side of the terminals 112 of the display device 100 is defined as a lower portion, while an opposing side to the terminals 112 is defined as an upper portion for convenience. When the substrate 102 and the display region 106 can be regarded as a rectangle mainly formed with four sides, a side of the terminal 112 side is referred to as a lower side whereas a side opposite to the terminals 112 is referred to as an upper side.

2. Pixel 2-1. Pixel Circuit

A pixel circuit including a display element 130 is disposed in each pixel 104. The pixel circuit is operated by the scanning-line driver circuits 108, the signal-line driver circuit 110, and the like. With this structure, the operation of the display elements 130 is controlled, and as a result, an image can be displayed on the display region 106. Hereinafter, the pixel circuit is explained using an example where a light-emitting element is used as the display element 130.

Figure 2:
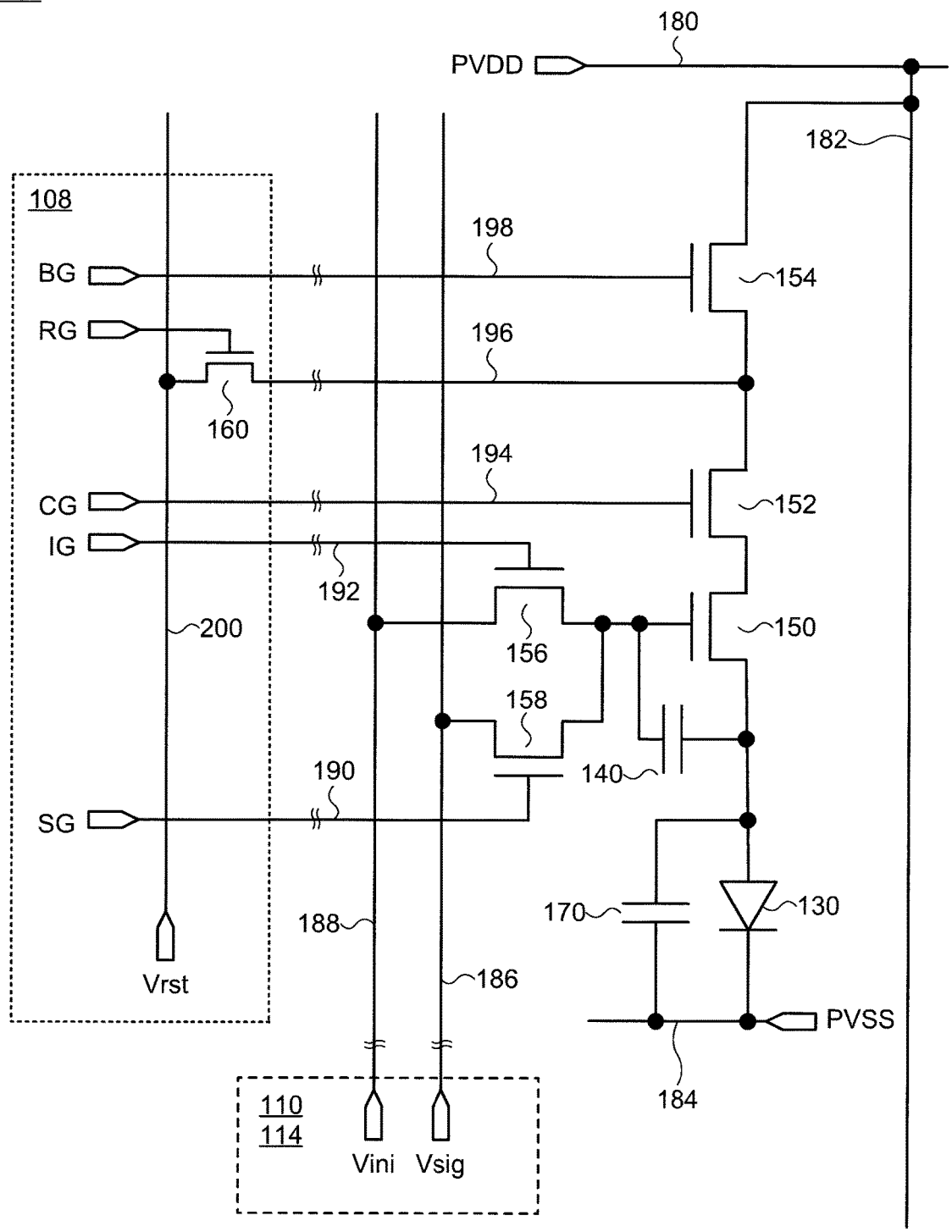
FIG. 2 is an equivalent circuit of a pixel circuit of a display device according to an embodiment of the present invention.

The structure of the pixel circuit may be arbitrarily selected, and an example is shown in FIG. 2 as an equivalent circuit. The pixel circuit illustrated in FIG. 2 includes a driving transistor 150, an emission-controlling transistor 154, a compensating transistor 152, an initializing transistor 156, a writing transistor 158, a storage capacitor 140, and a supplemental capacitor 170 in addition to the display element 130. A high potential PVDD is provided to a high-potential power-source line 180, and its potential is supplied to the pixels 104 connected to each column through a current-supplying line 182. The display element 130, the driving transistor 150, the emission-controlling transistor 154, and the compensating transistor 152 are connected in series between the high-potential power-source line 180 and a low-potential power-source line 184. The low-potential power-source line 184 is provided with a low potential PVSS.

A gate of the driving transistor 150 is electrically connected to a first signal line 188 through the initializing transistor 156 and is also electrically connected to a second signal line 186 through the writing transistor 158. The first signal line 188 is provided with an initializing signal Vini, while the second signal line 186 is provided with an image signal Vsig. Operation of the writing transistor 158 is controlled with a scanning signal SG provided to the write-controlling scanning line 190 connected to a gate thereof. A gate of the initializing transistor 156 is connected to the initialization-controlling scanning line 192 provided with an initialization-controlling signal IG, and operation thereof is controlled by the initialization-controlling signal IG.

A compensation-controlling scanning line 194 applied with a compensation-controlling signal CG and an emission-controlling scanning line 198 applied with an emission-controlling signal BG are respectively connected to gates of the compensating transistor 152 and the emission-controlling transistor 154. A reset-controlling line 196 is connected to a drain of the driving transistor 150 via the compensating transistor 152. The reset-controlling line 196 is connected to a reset transistor 160 disposed in the scanning-line driver circuit 108. The reset transistor 160 is controlled with a reset-controlling signal RG, by which a reset potential Vrst provided to a reset signal line 200 can be applied to the drain of the driving transistor 150.

The storage capacitor 140 is disposed between a source and the gate of the driving transistor 150, and the supplemental capacitor 170 is formed between the source of the driving transistor 150 and the low-potential power-source line 184. Although not illustrated, the supplemental capacitor 170 may be disposed so that both terminals thereof are respectively connected to the source of the driving transistor 150 and the high-potential power-source line 180.

The signal-line driver circuit 110 or the driver IC 114 outputs the initializing signal Vini and the image signal Vsig to the first signal line 188 and the second signal line 186, respectively. On the other hand, the scanning-line driver circuits 108 respectively output the scanning signal SG, the initialization-controlling signal IG, the compensation-controlling signal CG, the emission-controlling signal BG, and the reset-controlling signal RG to the write-controlling scanning line 190, the initialization-controlling scanning line 192, the compensation-controlling scanning line 194, the emission-controlling scanning line 198, and a gate of the reset transistor 160.

The pixel circuit shown in FIG. 2 is merely an example, and there is no limitation to the number of the transistors and capacitors and their connection relationship.

2-2. Cross-Sectional Structure

Figure 3:
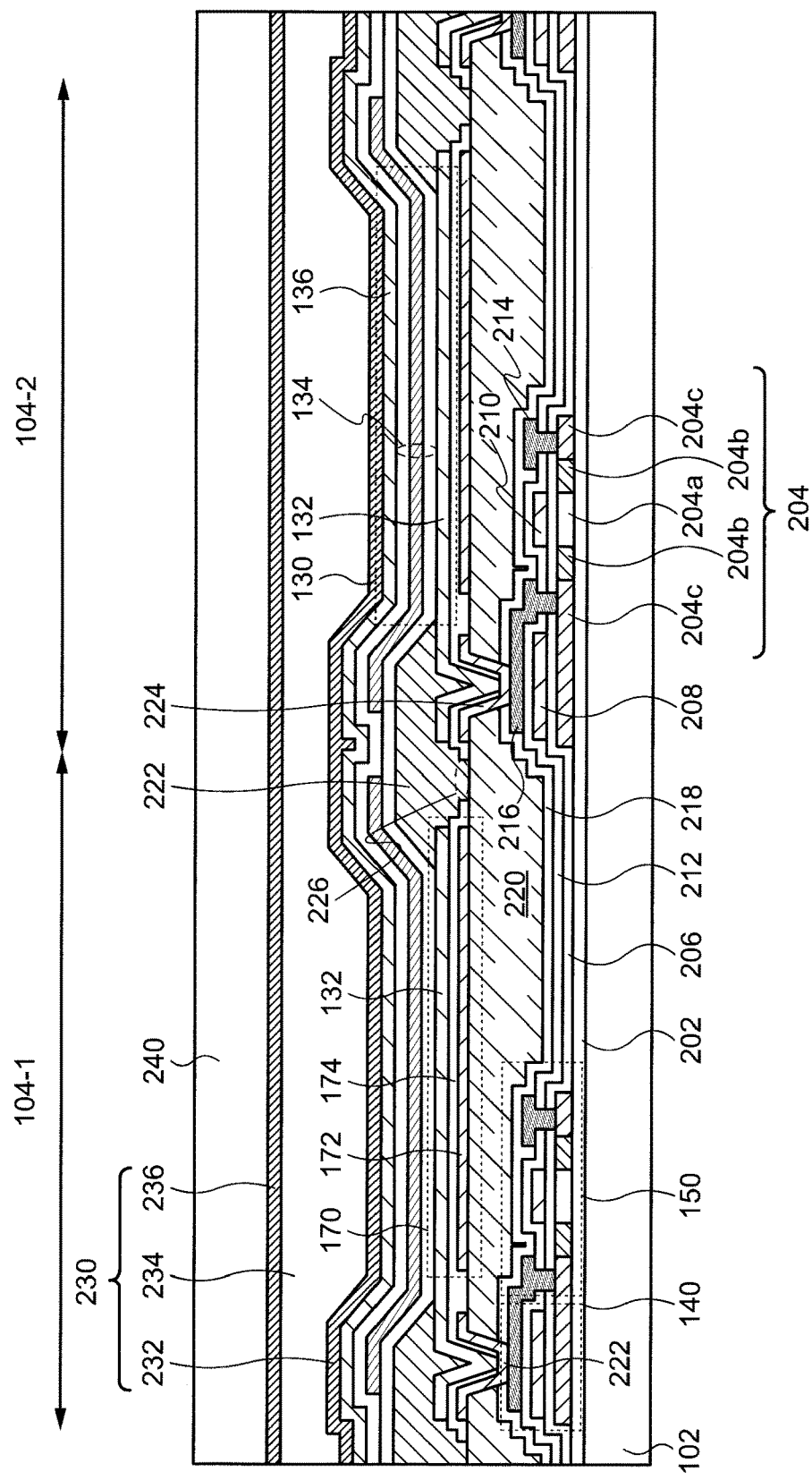
FIG. 3 is a schematic cross-sectional view of a display device according to an embodiment of the present invention.

A schematic cross-sectional view of two adjacent pixels 104 is shown in FIG. 3. The display element 130 as well as the storage capacitor 140, the driving transistor 150, and the supplemental capacitor 170 connected thereto are illustrated in FIG. 3.

Each element such as the driving transistor 150 and the storage capacitor 140 is disposed over the substrate 102 via an undercoat 202. The substrate 102 has a function to support the circuit formed thereover and may include glass, quartz, or a polymer. When a polymer such as a polyimide, a polyamide, and a polycarbonate is used for the substrate 102, flexibility can be added to the display device 100, thereby providing a so-called flexible display.

The driving transistor 150 has a semiconductor film 204, a gate insulating film 206 over the semiconductor film 204, a gate electrode 210 over the gate insulating film 206, a first interlayer insulating film 212 over the gate electrode 210, and a drain electrode 214 and a source electrode 216 over the first interlayer insulating film 212, and the like. The semiconductor film 204 may have an active region 204a, low-concentration impurity regions 204b sandwiching the active region 204a, and high-concentration impurity regions 204c sandwiching these regions. Although the driving transistor 150 is illustrated as a transistor with a top-gate structure in FIG. 3, the structure of the transistors constructing the pixel circuit is not limited and transistors with a variety of structures may be employed.

The storage capacitor 140 is configured by a part of the semiconductor film 204 (high-concentration impurity region 204c), the gate insulating film 206 thereover, a capacitor electrode 208 existing in the same layer as the gate electrode 210, the first interlayer insulating film 212 over the capacitor electrode 208, and a part of the source electrode 216. Here, the gate insulating film 206 and the first interlayer insulating film 212 function as a dielectric of the storage capacitor 140.

A second interlayer insulating film 218 and a leveling film 220 over the second interlayer film 218 are arranged over the driving transistor 150 and the storage capacitor 140. The second interlayer insulating film 218 is formed in order to prevent the entrance of impurities to the elements such as the transistors and the capacitors in the pixel circuits. Depressions and projections caused by the pixel circuit including the driving transistor 150, the storage capacitor 140, and the like are absorbed by the leveling film 220, giving a flat surface.

An opening reaching the source electrode 216 is formed in the leveling film 220 and the second interlayer insulating film 218. A connection pad 224 covering this opening and a part of the leveling film 220 is disposed so as to be in contact with the source electrode 216, and a supplemental capacitor electrode 172 is formed over the leveling film 220. A third interlayer insulating film 174 is further formed to cover the connection pad 224 and the supplemental capacitor electrode 172. The third interlayer film 174 does not cover a part of the connection pad 224 in the opening formed in the leveling film 220 and exposes an upper surface of the connection pad 224. This structure enables electrical connection between the connection pad 224 and a pixel electrode 132 of the display element 130 formed thereover. An opening 226 may be formed in the third interlayer film 174 to allow a partition wall (also called a rib or a bank) 222 formed thereover to be in contact with the leveling film 220. Note that the formation of the connection pad 224 and the opening 226 is optional. Formation of the connection pad 224 prevents oxidation of a surface of the source electrode 216 in the following processes, by which an increase in contact resistance can be suppressed. The opening 226 functions as an opening for releasing impurities such as water and oxygen from the leveling film 220, by which reliability of the semiconductor elements and the display element 130 in the pixel circuit can be increased.

The pixel electrode 132 is provided over the third interlayer insulating film 174 so as to overlap the connection pad 224 and the supplemental capacitor electrode 172. The pixel electrode 132 is electrically connected to the source electrode 216 via the connection pad 224 in the opening formed in the third interlayer insulating film 174 and the leveling film 220. The supplemental capacitor 170 is configured by the supplemental capacitor electrode 172, the third interlayer insulating film 174, and the pixel electrode 132. Hence, the pixel electrode 132 is shared by the supplemental capacitor 170 and the display element 130.

A silicon-containing inorganic compound may be used for the undercoat 202, the gate insulating film 206, the first interlayer film 212, the second interlayer film 218, and the third interlayer film 174, for example. As a silicon-containing inorganic compound, silicon oxide containing oxygen and silicon, silicon oxynitride or silicon nitride oxide containing oxygen, silicon, and nitrogen, silicon nitride containing silicon and nitrogen and the like are represented. These films may each have a single-layer structure or a stacked-layer structure. The leveling film 220 and the partition wall 222 contain an organic compound. As a typical organic compound, an acrylic resin, an epoxy resin, a polysiloxane resin, a polyimide resin, a polyamide resin and the like are exemplified.

The gate electrode 210, the capacitor electrode 208, the drain electrode 214, and the source electrode 216 are configured to include titanium, molybdenum, tungsten, tantalum, aluminum, copper, or an alloy thereof. These electrodes may be configured to have a structure in which a metal with a high conductivity, such as aluminum and copper, is sandwiched by a metal with a high melting point, such as titanium, molybdenum, tungsten, and tantalum.

The display element 130 is structured by the pixel electrode 132, a counter electrode 136 over the pixel electrode 132, and an EL layer 134 sandwiched by the pixel electrode 132 and the counter electrode 136. The pixel electrode 132 includes a conductive oxide exhibiting a transmitting property with respect to visible light, such as a mixed oxide of indium and tin (ITO) and a mixed oxide of indium and zinc (IZO), a metal such as silver and aluminum, or an alloy thereof. The pixel electrode 132 may have a single-layer structure or a stacked-layer structure. When the pixel electrode 132 has a stacked-layer structure, a structure may be employed in which a film including a metal is sandwiched by films including a conductive oxide such as ITO and IZO, for example.

The EL layer 134 is formed to cover the pixel electrode 132 and the partition wall 222. Here, the EL layer 134 means all of the layers disposed between the pixel electrode 132 and the counter electrode 136. The EL layer may be structured by a plurality of layers and may be formed by combining a variety of functional layers such as a carrier-injection layer, a carrier-transporting layer, an emission layer, a charge-blocking layer, and an exciton-blocking layer. The display element 130 may be configured so that the structure of the EL layer 134 is the same in all of the pixels 104 or different between adjacent pixels 104. For example, the EL layer 134 is configured so that the structure or material in the emission layer is different between adjacent pixels 104, by which light emissions with colors different from each other can be obtained from adjacent pixels 104. When the same EL layer 134 is utilized in all of the pixels 104, a plurality of emission colors can be obtained by arranging a color filter. In FIG. 3, a structure is illustrated for visibility in which a hole-injection/transporting layer, an emission layer, and an electron-injection/transporting layer are stacked as typical functional layers from the pixel electrode 132.

The counter electrode 136 is formed across the plurality of pixels 104. That is, the counter electrode 136 is shared by the plurality of pixels 104. The counter electrode 136 includes a conductive oxide having a light-transmitting property, such as ITO and IZO, a metal such as aluminum, magnesium, and silver, or an alloy thereof, for example. When the light emission obtained in the EL layer 134 is extracted through the pixel electrode 132, the pixel electrode 132 is formed so as to include a conductive oxide and the counter electrode 136 is formed using a metal having a high reflectance with respect to visible light, such as aluminum and silver. On the other hand, when the light emission obtained in the EL layer 134 is extracted through the counter electrode 136, the pixel electrode 132 is formed so as to include a metal with a high reflectance with respect to visible light, such as aluminum and silver, and the counter electrode 136 is formed so as to have a light-transmitting property with respect to visible light. Specifically, the counter electrode 136 may be structured by a film including a conductive oxide such as ITO and IZO or a metal thin film including a metal such as silver, magnesium, or aluminum and having a thickness which allows visible light to pass therethrough.

A protection film (hereinafter, referred to as a passivation film) 230 is disposed over the display elements 130 to protect the display elements 130. The structure of the passivation film 230 may be arbitrarily selected. For example, it is possible to apply a stacked structure having a first inorganic film 232 containing an inorganic compound, an organic film 234 containing an organic compound, and a second inorganic film 236 containing an inorganic compound to the passivation film 230 as shown in FIG. 3. In this case, the aforementioned inorganic compounds containing silicon may be used as an inorganic compound. As an organic compound, a polymer such as an epoxy resin and acrylic resin may be used.

The first inorganic film 232 and the second inorganic film 236 having a low gas permeability effectively suppress the entrance of impurities from the outside. The organic film 234 may have a relatively large thickness, by which depressions and projections caused by the partition wall 222 or a foreign object are absorbed to provide a flat upper surface. The flattening ability of the organic film 234 improves evenness of the second inorganic film 236 formed thereover and prevents formation of a crack or a pinhole in the second inorganic film 236, thereby more effectively protecting the display elements 130.

A resin film 240 is disposed over the passivation film 230. The resin film 240 protects the display region 106, serves as a mask for removing the first inorganic film 232 and the second inorganic film 236 formed over the terminals 112 by an etching treatment to expose the terminals 112, and has a function to protect the passivation film 230 during the etching treatment. The resin film 240 also includes a polymer as an organic compound, and an acrylic resin, an epoxy resin, a polyolefin resin, and the like are represented as a polymer. Although not illustrated, the display device 100 may have a touch sensor between the passivation film 230 and the resin film 240 or over the resin film 240.

3. Peripheral Region 3-1. Structure

Figure 4:
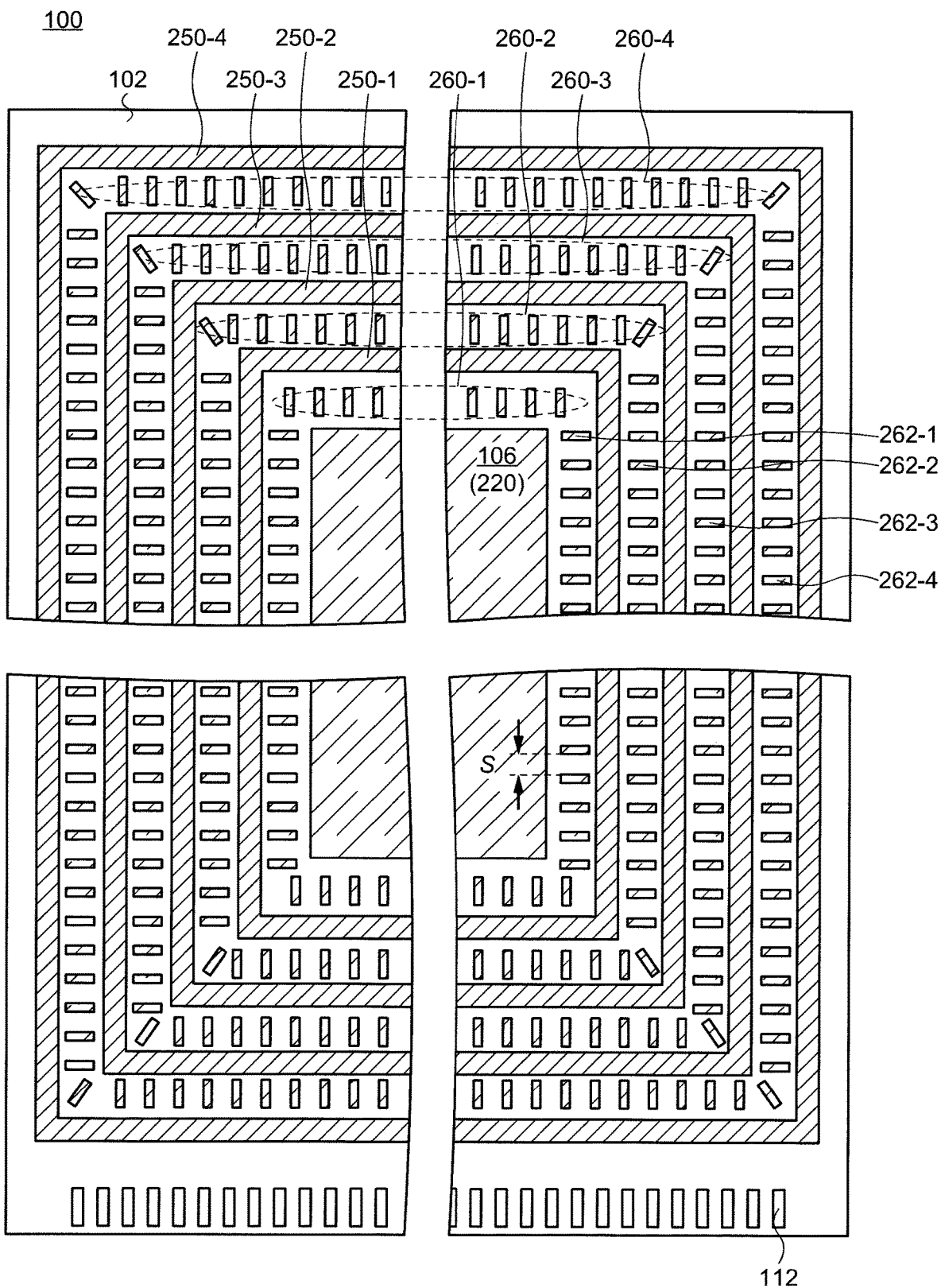
FIG. 4 is a schematic top view of a display device according to an embodiment of the present invention.

A schematic top view of the structures of the four corners of the display device 100 is shown in FIG. 4. In this figure, the components such as the display elements 130, the passivation film 230, the resin film 240, and the like are omitted. As described below in detail, the display device 100 has at least one guide 260 surrounding the display region 106 and a plurality of dams 250. In FIG. 4, an example is demonstrated where the display device 100 has four dams (a first dam 250-1, a second dam 250-2, a third dam 250-3, and a fourth dam 250-4) and four guides (a first guide 260-1, a second guide 260-2, a third guide 260-3, and a fourth guide 260-4). Each guide 260 includes a plurality of insulating films (hereinafter, referred to as guide insulating films) 262. Specifically, the first guide 260-1, the second guide 260-2, the third guide 260-3, and the fourth guide 260-4 are configured to respectively include a plurality of first guide insulating films 262-1, a plurality of second guide insulating films 262-2, a plurality of third guide insulating films 262-3, and a plurality of fourth guide insulating films 262-4. Hereinafter, these components are explained in detail.

3-2. Upper Peripheral Region

Figure 5:
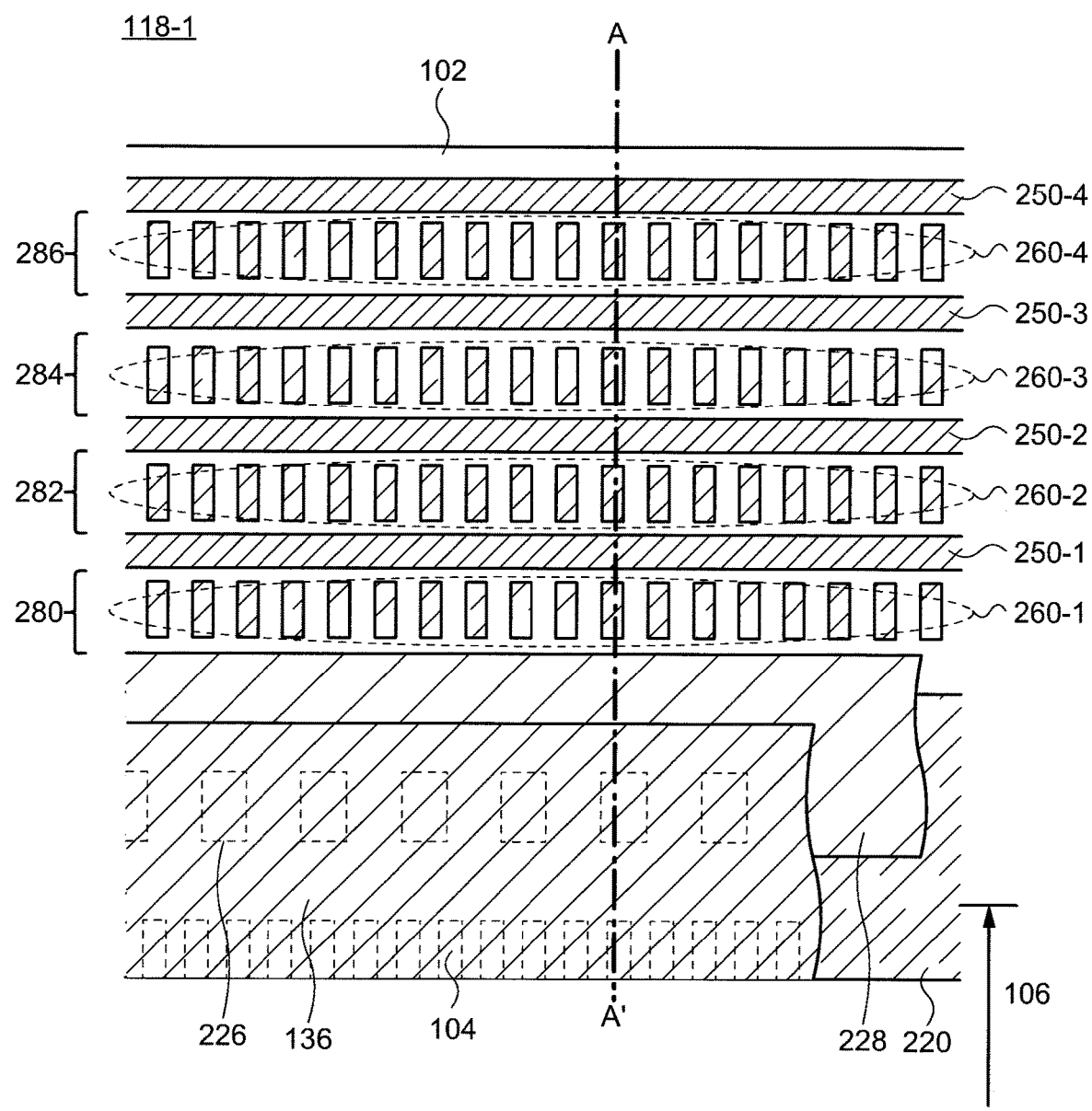
FIG. 5 is a schematic top view of a display device according to an embodiment of the present invention.
Figure 6:
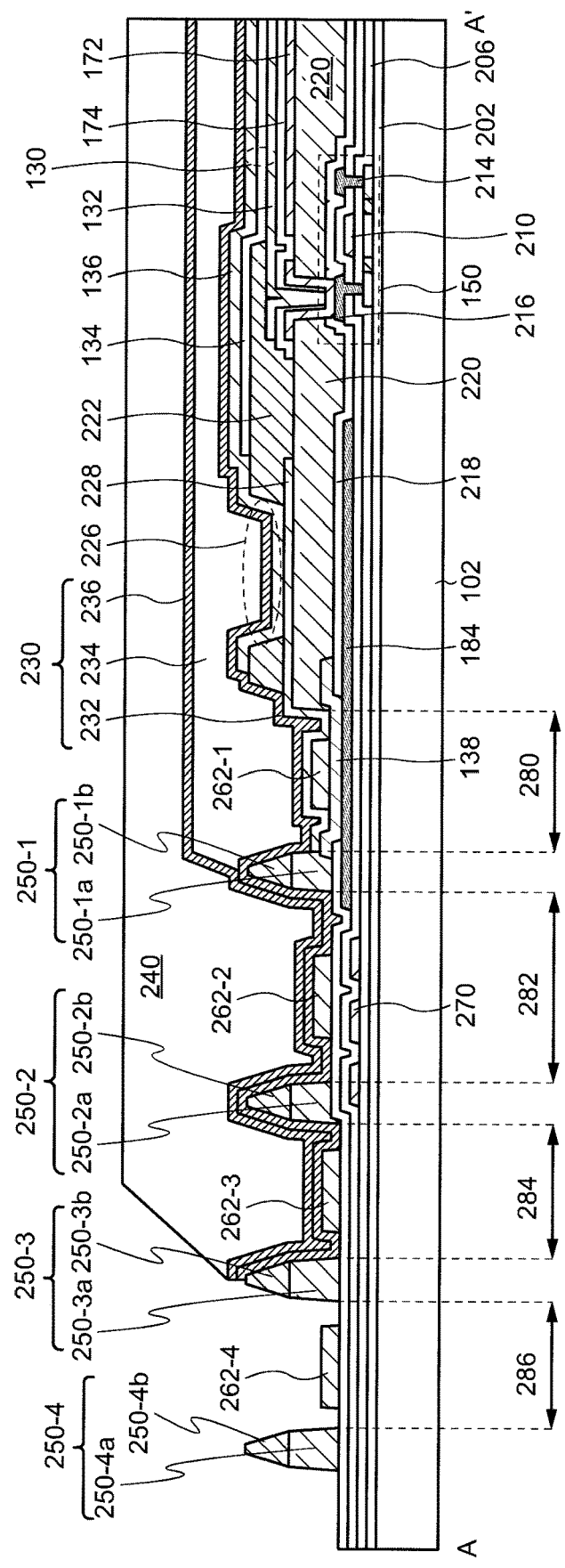
FIG. 6 is a schematic cross-sectional view of a display device according to an embodiment of the present invention.

A schematic top view of a region 118-1 (see FIG. 1) located on a side opposite to the terminals 112 with respect to the display region 106 is shown in FIG. 5, and a schematic view of a cross-section along a chain line A-A' in FIG. 5 is illustrated in FIG. 6. In these figures, the peripheral region and a part of the pixel 104 adjacent to the peripheral region are illustrated.

As shown in FIG. 6, one or a plurality of wirings 270, the low-potential power-source line 184, a first connection wiring 138 connected to the low-potential power-source line 184 and the like, which extend substantially parallel to the upper side of the substrate 102, are disposed in the peripheral region. There is no limitation to the number, usage, and function of the wirings 270, and the wirings 270 may function as the high-potential power-source line 180 for providing PVDD to the pixel electrodes 132 or as the signal lines for transmitting a variety of signals to the driver circuits, for example. In FIG. 6, an example is demonstrated where the wirings 270 and the low-potential power-source line 184 respectively exist in the same layer as the gate electrode 210 and the source electrode 216 (drain electrode 214). However, the wirings 270 may exist in the same layer as the source electrode 216 (drain electrode 214), and the low-potential power-source line 184 may exist in the same layer as the gate electrode 210. Alternatively, one or both of the wirings 270 and the low-potential power-source line 184 may be prepared using a metal film formed in a different layer from the gate electrode 210 and the source electrode 216 (drain electrode 214). The first connection wiring 138 is configured to include a conductive oxide such as ITO and IZO or a metal such as titanium, tungsten, molybdenum, and aluminum.

The counter electrode 136 extends from the display region 106 to the peripheral region and is electrically connected to the low-potential power-source line 184 in the peripheral region. With this structure, the counter electrode 136 can be entirely supplied with substantially the same potential in the entire display region. The counter electrode 136 may be in direct contact with the low-potential power-source line 184, or this electrical connection may be carried out through the first connection wiring 138 and a second connection wiring 228 as shown in FIG. 6. The second connection wiring 228 is located over the leveling film 220 and is partly exposed from the partition wall 222 in a plurality of openings 226 formed in the partition wall 222 (FIG. 5 and FIG. 6). The counter electrode 136 and the second connection wiring 228 are connected in these openings 226. Since the second connection wiring 228 may be formed in the same process as the pixel electrode 132, these elements may have the same structure and exist in the same layer.

As shown in FIG. 4 to FIG. 6, the first guide 260-1 is located in a region (first region 280) between the leveling film 220 and the first dam 250-1. The second guide 260-2 is located in a region (second region 282) between the first dam 250-1 and the second dam 250-2. The third guide 260-3 is located in a region (third region 284) between the second dam 250-2 and the third dam 250-3. The fourth guide 260-4 is located in a region (fourth region 286) between the third dam 250-3 and the fourth dam 250-4.

The leveling film 220 formed in the display region 106 extends in a direction toward the upper side of the substrate 102 so as to cover a part of the low-potential power-source line 184 (FIG. 5 and FIG. 6). However, a part of the leveling film 220 is removed in the peripheral region, and the plurality of dams 250 and the plurality of guides 260 are formed by the residual leveling film 220. Note that, although the leveling film 220 under the display element 130 and the leveling film 220 under the second connection wiring 228 appear to be separated in FIG. 6, the opening used for the electrical connection between the source electrode 216 and the display element 130 does not completely separate these components.

The first dam 250-1 and the second dam 250-2 have a function to control the shape and position of the organic film 234, while the third dam 250-3 and the fourth dam 250-4 have a function to control the shape and position of the resin film 240. As described below for the manufacturing method of the display device 100, the organic film 234 and the resin film 240 are formed using a wet-type film-forming method such as an ink-jet method and a printing method. That is, a solution or a suspension of a resin serving as a raw material or a precursor thereof (hereinafter, the solution and the suspension are collectively referred as a raw-material fluid) is discharged or applied over the first inorganic film 232 or the second inorganic film 236, and then a solvent in the raw-material fluid is evaporatively removed and/or the precursor is reacted to form the organic film 234 and the resin film 240. The raw-material fluid providing the organic film 234 is discharged or applied so as to spread over the first inorganic film 232 and cover the entire display region 106. At this time, a part of the raw-material fluid overflowing from the display region 106 is dammed by the first dam 250-1. Accordingly, the organic film 234 can be selectively formed within the first dam 250-1. Note that, when the raw-material fluid overflows outside from the first dam 250-1 the raw-material fluid is dammed by the second dam 250-2, thereby preventing the formation of the organic film 234 on a side of the edge portion of the substrate 102 than the second dam 250-2.

Similarly, the raw-material fluid providing the resin film 240 is discharged or applied so as to spread over the second inorganic film 236 and cover the entire display region 106 and the organic film 234. At this time, a part of the raw-material fluid overflowing from the display region 106 and the organic film 234 is dammed by the third dam 250-3. Accordingly, the resin film 240 can be selectively formed within the third dam 250-3. Note that when the raw-material fluid overflows outside from the third dam 250-3, the raw-material fluid is dammed by the fourth dam 250-4, thereby preventing the formation of the resin film 240 on a side of the edge portion of the substrate 102 than the fourth dam 250-4.

The shapes and positions of the organic film 234 and the resin films 240 are controlled on the basis of this mechanism. Thus, the organic film 234 covers at least a part of the first guide 260-1. The organic film 234 may cover a part of the first dam 250-1 as shown in FIG. 6 or may be arranged so that an edge portion thereof is positioned between the first dam 250-1 and the leveling film 220 although not illustrated. When the organic film 234 covers the first dam 250-1, the organic film 234 may be formed so that the organic film 234 further covers a part of the second dam 250-2 or the edge portion thereof is positioned between the second dam 250-2 and the first dam 250-1.

The resin film 240 covers the edge portion of the organic film 234. That is, the edge portion of the resin film 240 is positioned between an edge portion of the substrate 102 closest thereto and the edge portion of the organic film 234. The resin film 240 covers the first dam 250-1 and the second dam 250-2. The resin film 240 may cover a portion of the third dam 250-3 as shown in FIG. 6 or may be arranged so that an edge portion thereof is positioned between the third dam 250-3 and the second dam 250-2 although not illustrated. Alternatively, the resin film 240 may be arranged so that the resin film 240 covers a part of the fourth dam 250-4 in addition to the third dam 250-3 or the edge portion thereof is positioned between the third dam 250-3 and the fourth dam 250-4. As shown in FIG. 6, the first inorganic film 232 and the second inorganic film 236 of the passivation film 230 cover at least the first dam 250-1 and preferably cover the second dam 250-2 and a part of the third dam 250-3.

The guides 260 have the same composition as the leveling film 220. That is, the guide insulating films 262 contain the organic compound included in the leveling film 220. The dams 250 each have a two-layer structure of a first layer 250a and a second layer 250b located over the first layer 250a. The first layer 250a has the same composition as the leveling film 220 and contains the organic compound included in the leveling film 220. Hence, the leveling film 220, the guide insulating films 262, and the first layers 250a of the dams 250 exist in the same layer. The heights of the guides 260, that is, the heights of the guide insulating films 262 are smaller than the height of the leveling film 220 and the heights of the first layers 250a. In other words, the top surfaces of the guide insulating films 262 are closer to the substrate 102 than the top surfaces of the leveling film 220 and the first layers 250a. As described below, the second layers 250b have the same composition as the partition wall 222. Namely, the second layers 250b contain the organic compound included in the partition wall 222.

3-3. Side Peripheral Region

Figure 7:
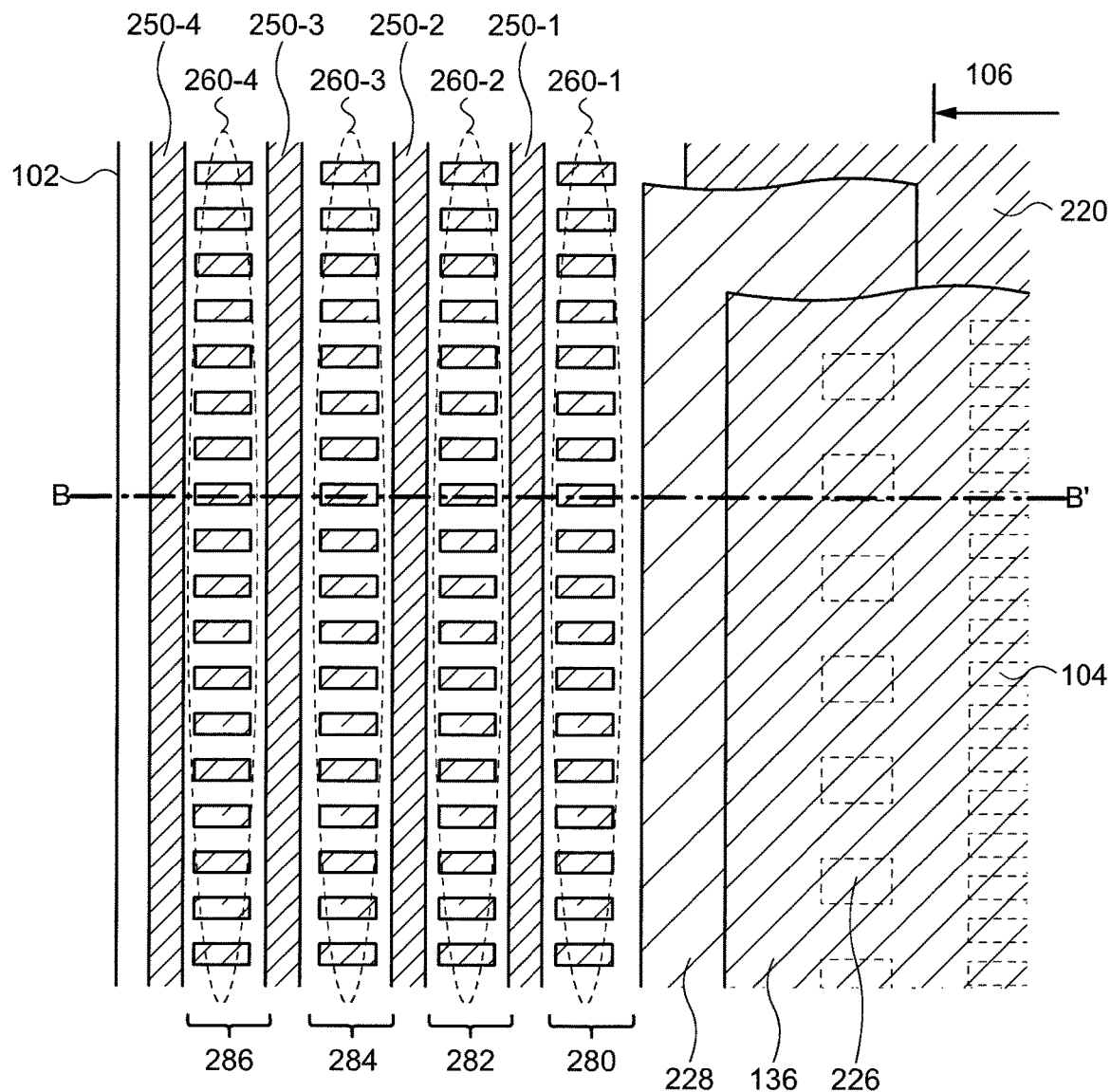
FIG. 7 is a schematic top view of a display device according to an embodiment of the present invention.
Figure 8:
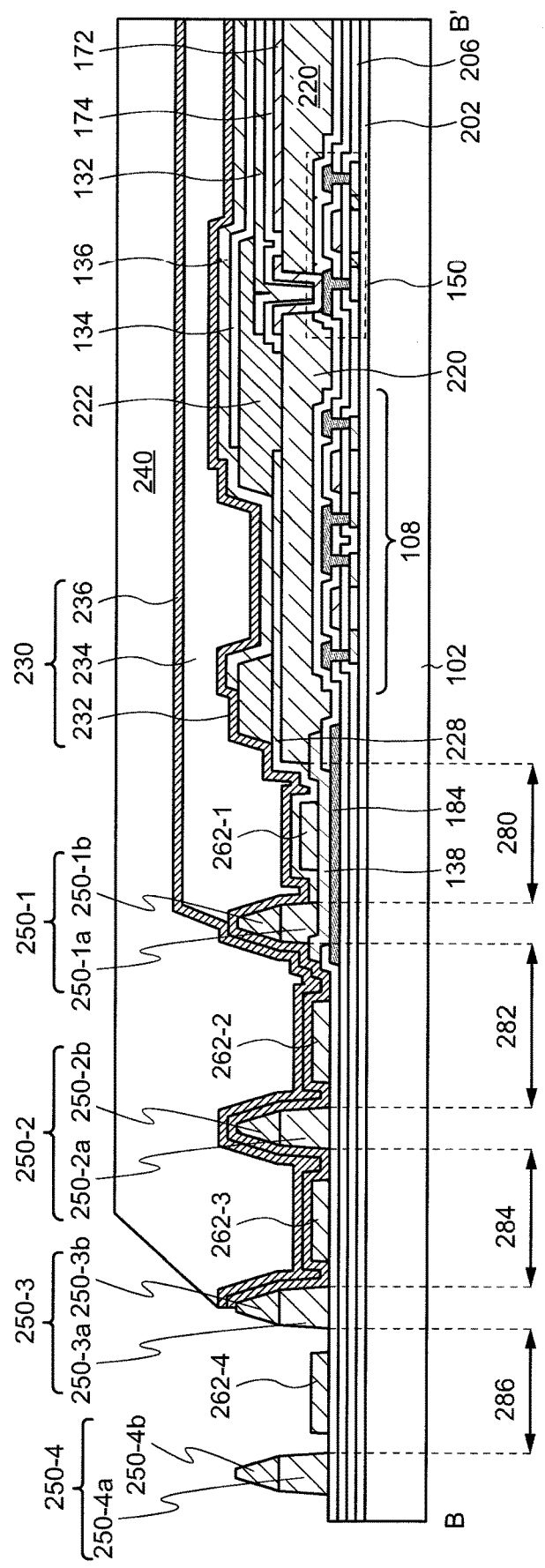
FIG. 8 is a schematic cross-sectional view of a display device according to an embodiment of the present invention.

A schematic top view of a region 118-2 (see FIG. 1) including a part of the long side of the display device 100 is shown in FIG. 7, and a schematic cross-sectional view along a chain line B-B' in FIG. 7 is illustrated in FIG. 8. In these figures, the peripheral region and a part of the pixel 104 close to the peripheral region are demonstrated. Hereinafter, an explanation of the structure the same as or similar to that in the region 118-1 may be omitted.

As shown in FIG. 8, transistors and the like included in the scanning-line driver circuit 108 are disposed in the peripheral region. Similar to the region 118-1 (FIG. 6), the counter electrode 136 extends from the display region 106 to the peripheral region and is electrically connected to the low-potential power-source line 184 in the peripheral region. Similar to the region 118-1 (FIG. 6), at least one guide 260 and the plurality of dams 250 are formed in the peripheral region as shown in FIG. 4, FIG. 7, and FIG. 8.

3-4. Lower Peripheral Region

Figure 9:
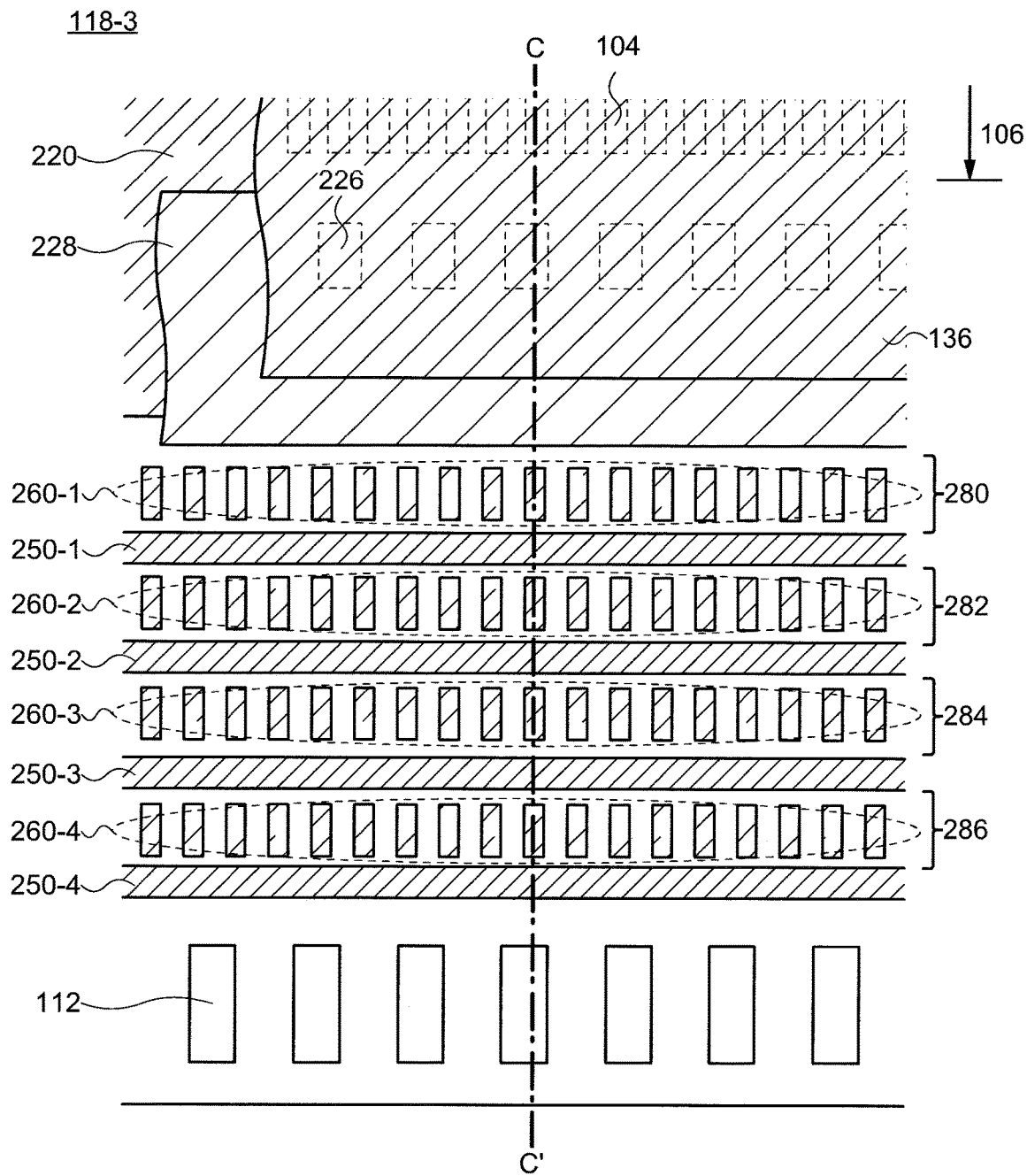
FIG. 9 is a schematic top view of a display device according to an embodiment of the present invention.
Figure 10:
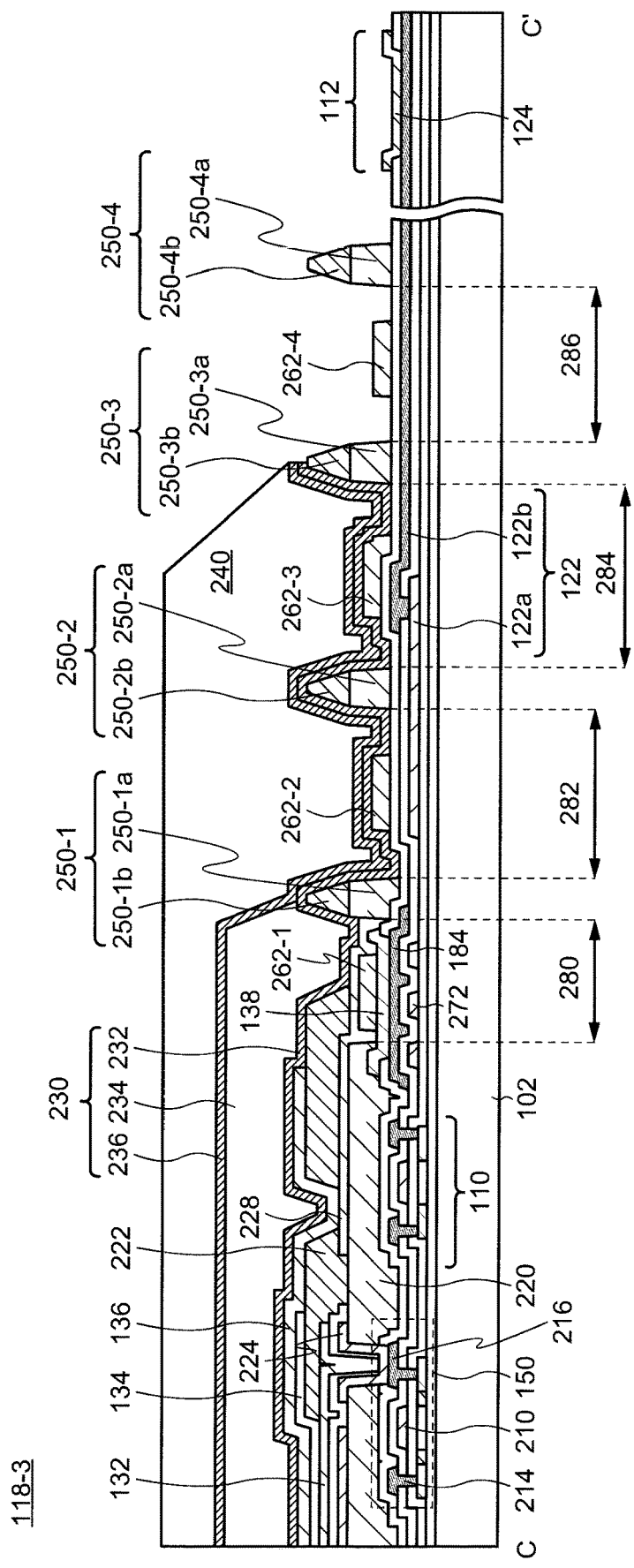
FIG. 10 is a schematic cross-sectional view of a display device according to an embodiment of the present invention.

A schematic top view of a region 118-3 of the display region 106 (see FIG. 1) positioned on the terminal 112 side is shown in FIG. 9, and a schematic cross-sectional view along a chain line C-C' in FIG. 9 is illustrated in FIG. 10. The peripheral region and a part of the pixel 104 adjacent to the peripheral region are illustrated in these drawings. In the following explanation, an explanation of the structure the same as or similar to that in the region 118-1 or 118-2 may also be omitted.

As shown in FIG. 10, the signal-line driver circuit 110 including an analogue switch and the like is formed, and one or a plurality of wirings 272, the low-potential power-source line 184, and the first connection wiring 138 and the second connection wiring 228 connected to the low-potential power-source line 184, which extend substantially parallel to the lower side of the substrate 102, are further disposed in the peripheral region. A wiring 122 for supplying a variety of signals and a power source to the pixels 104 or the signal-line driver circuit 110 is formed between the display region 106 and the edge portion of the substrate 102. The wiring 122 may be formed with conductive films formed in a plurality of layers. For example, the wiring 122 may be formed by connecting a wiring 122a existing in the same layer as the gate electrode 210 of the driving transistor 150 with a wiring 122b existing in the same layer of the source electrode 216 (drain electrode 214) as shown in FIG. 10. The wiring 122 is exposed at the edge portion of the substrate 102 to form the terminal 112. A top surface of the wiring 122 may be covered with a protective conductive film 124 at the terminal 122. The protective conductive film 124 may be formed simultaneously with the pixel electrode 132 or the connection pad 224, for example, and may exist in the same layer as these components. Similar to the regions 118-1 and 118-2, the counter electrode 136 extends from the display region 106 to the peripheral region and is electrically connected to the low-potential power-source line 184 through the first connection wiring 138 and the second connection wiring 228 in the peripheral region. Similar to the regions 118-1 and 118-2, at least one guide 260 and the plurality of dams 250 are disposed in the peripheral region.

In the display device 100, it is not always necessary to provide four dams 250 and four guides 260, and the guide 260 may be disposed in at least one of the first region 280 to the fourth region 286 when the first dam 250-1 to the fourth dam 250-4 are provided. Alternatively, when two dams 250 are disposed, the guides 260 may be respectively formed in the region between the leveling film 220 and one dam 250 and the region between the two dams 250 or may be respectively formed in one of these regions. Alternatively, even in the case where the first dam 250-1 to the fourth dam 250-4 are disposed, the guides 260 may be formed in the first region 280 and the third region 284 without forming the guide 260 in the second region 282 and the fourth region 286 or may be respectively formed in the second region 282 and the fourth region 286 without forming the guide 260 in the first region 280 and the third region 284.

3-5. Structure of Guide

As shown in FIG. 4, each guide 260 is structured by the plurality of guide insulating films 262 containing the organic compound included in the leveling film 220. The guide insulating films 262 are each arranged so that the longest side thereof faces toward the display region 106. That is, each of the guide insulating films 262 is arranged so that the longest side thereof is perpendicular to or substantially perpendicular to the direction in which one of the sides of the display region 106 closest thereto extends.

For example, when focus is placed on the first guide 260-1, the side of the display region 106 (or the substrate 102) closest to the plurality of first guide insulating films 262-1 arranged parallel to the upper side and the lower side of the display region 106 (or the substrate 102) is the upper side or the lower side thereof. The longest sides of these first guide insulating films 262-1 are perpendicular to or substantially perpendicular to the direction in which the upper side or the lower side extends. Similarly, the side of the display region 106 (or the substrate 102) closest to the plurality of first guide insulating films 262-1 located in the side peripheral region of the display device 100 (e.g., the region 118-3) is the sides (longitudinal side) between the upper side and the lower side thereof. These longest sides of the first guide insulating films 262-1 are perpendicular to or substantially perpendicular to the direction in which the longitudinal sides extend. However, the longest sides of the guide insulating films 262 may be inclined from the direction in which the sides of the display region 106 (or the substrate 102) extend in the four corners of each guide 260.

Figure 11A:
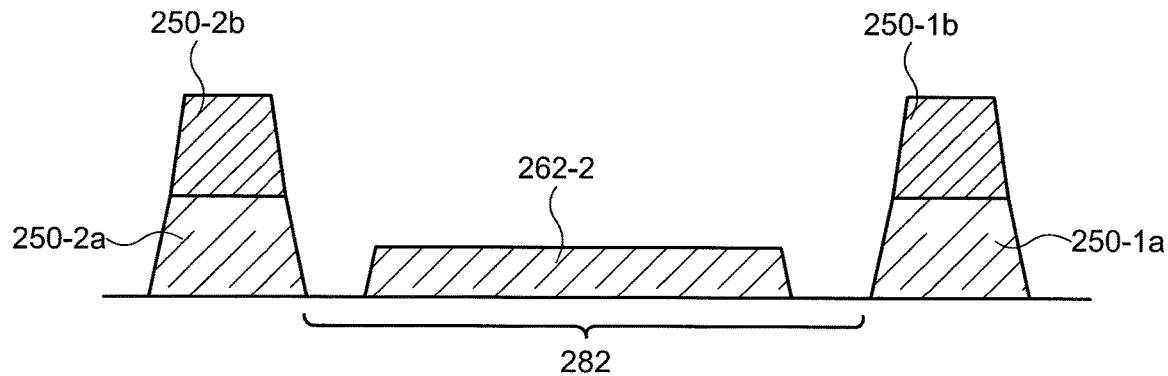
FIG. 11A to FIG. 11C are each a schematic cross-sectional view of a guide and a dam of a display device according to an embodiment of the present invention.
Figure 11B:
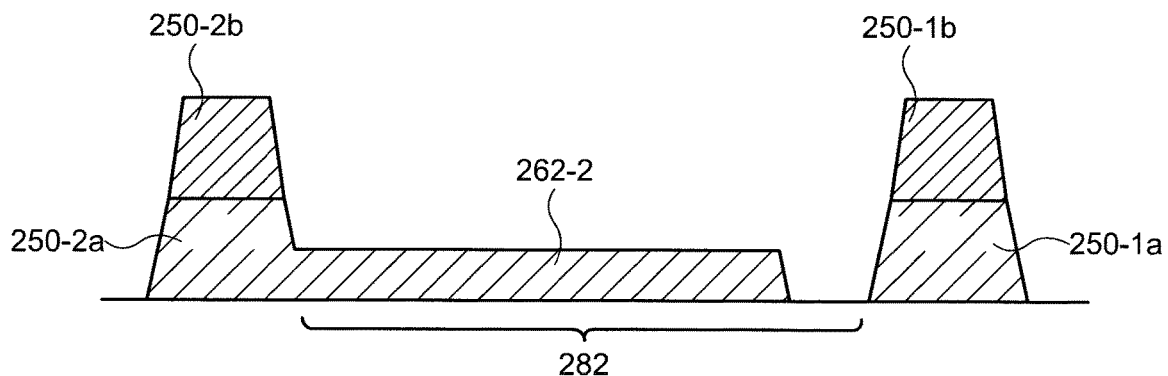
Figure 11C:
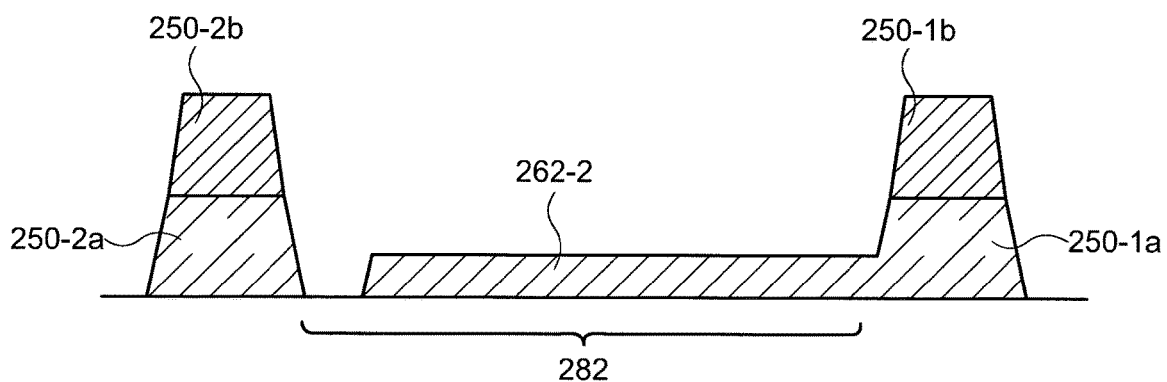

The first guide insulating films 262-1 are physically spaced away from at least one of the leveling film 220 and the first dam 250-1. Similarly, each of the second guide insulating films 262-1 to the fourth guide insulating films 262-4 is physically spaced away from at least one of the adjacent dams 250. For example, in the case of the second guide 260-2, the second guide insulating films 262-2 are spaced away from the first dam 250-1 and the second dam 250-2 (FIG. 11A) or are in contact with one of the first dam 250-1 and the second dam 250-2 (FIG. 11B, FIG. 11C). In the latter case, the second guide 260-2 is integrated with the first layer 150a of the dam 250 in contact therewith. The same is applied to other guides 260.

This structure contributes to the high reliability of the display device 100. As described below, the leveling film 220, the first layers 250a of the dams 250, and the guide 260 are formed from a single film including an organic compound in the same process. A film including an organic compound serves as a route for impurities due to its higher permeability to impurities such as water and oxygen compared with a film including an inorganic compound. However, this film is divided in the peripheral region to provide the leveling film 220, the first layers 250a, and the guides 260. Hence, there is no route for impurities to enter the display region 106 from the outside through this film, deterioration of the display element 130 is suppressed, and the display device 100 exhibits high reliability.

Figure 12A:
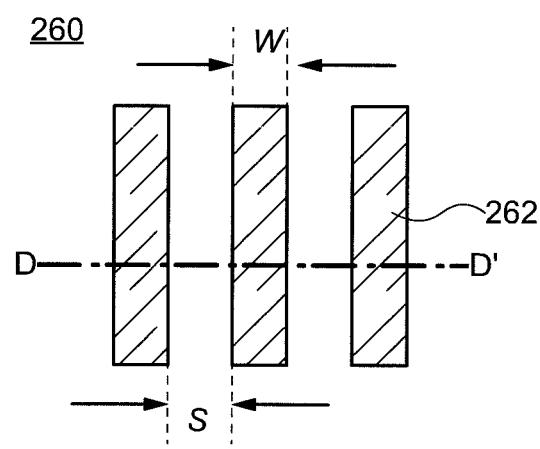
FIG. 12A and FIG. 12B are respectively schematic top and cross-sectional views of a guide of a display device according to an embodiment of the present invention; embodiment of the present invention.
Figure 12B:
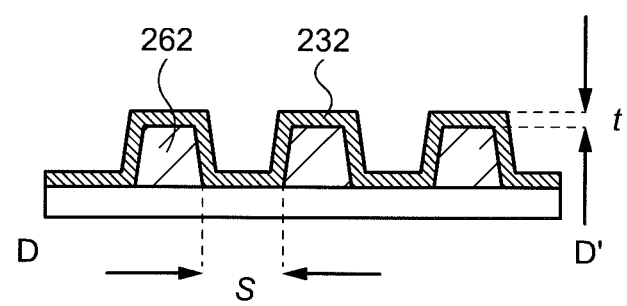

A schematic top view of the guide insulating films 262 is shown in FIG. 12A, and a schematic cross-sectional view along a chain line D-D' in FIG. 12A is shown in FIG. 12B. In FIG. 12B, the first inorganic film 232 disposed over the guide insulating films 262 is also illustrated. It is preferred to configure the plurality of guide insulating films 262 included in each guide 260 so that an interval S between two adjacent guide insulating films 262 is equal to or more than twice a thickness t of the first inorganic film 232. Moreover, in the case where the organic film 234 and the resin film 240 are formed with an ink-jet method, the interval S is preferred to be equal to or less than d/2 where d is a diameter of a droplet of the raw-material fluid providing the organic film 234 or the resin film 240. As described below, arrangement of the guide insulating films 262 so as to have such an interval S enables precise control of the region in which the organic film 234 and the resin film 240 are to be disposed. More specifically, a width W of each guide insulating film 262 may be equal to or more than 10 µm and equal to or less than 100 µm, equal to or more than 10 µm and equal to or less than 50 µm, or equal to or more than 20 µm and equal to or less than 50 µm. The interval S may be equal to or more than 10 µm and equal to or less than 150 µm, equal to or more than 10 µm and equal to or less than 100 µm, or equal to or more than 20 µm and equal to or less than 50 µm. The width W and the interval S may be different between the guides 260.

3-6. Shape Control of Organic Film and Resin Film

As described above, when the organic film 234 and the resin film 240 are formed by applying a wet-type film-formation method, the discharged or applied raw-material fluid spreads over the first inorganic film 232 or the second inorganic film 236. Appropriate control of the amount and viscosity of the raw-material fluid as well as the affinity of the raw-material fluid to the first inorganic film 232 and the second inorganic film 236 allows the raw-material fluid to be adequately dammed with the corresponding dam 250. Accordingly, the positions and the shapes of the organic film 234 and the resin film 240 can be controlled.

Figure 13:
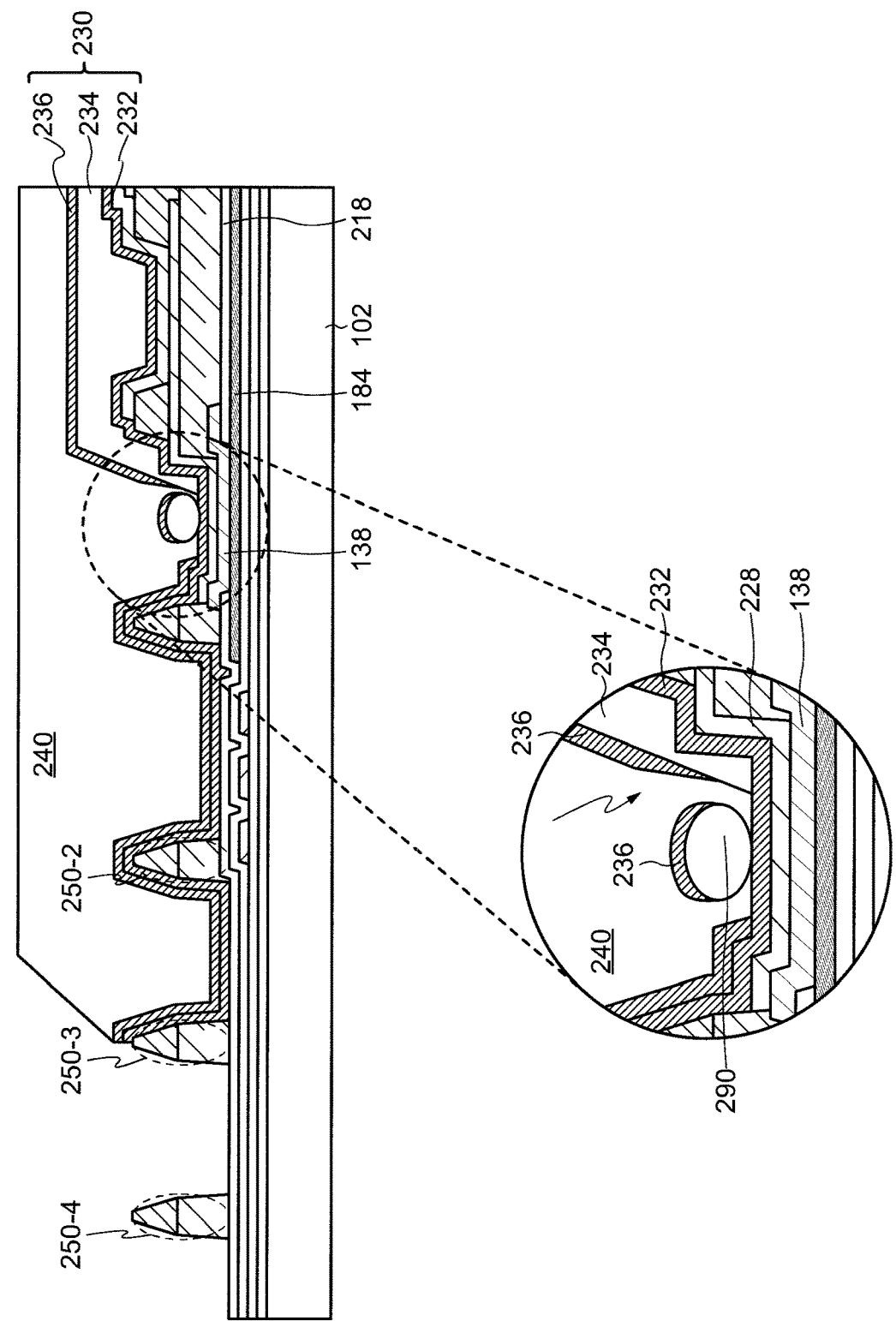
FIG. 13 is a schematic cross-sectional view for explaining an example of a manufacturing process of a traditional display device.

However, although the ink-jet method and the printing method are represented as a method to prepare a thin film with a relatively high positional selectivity, it is not always easy to appropriately control the aforementioned parameters. Accordingly, the shape and the position of the obtained thin film may not be precisely controlled. For example, if the raw-material fluid does not sufficiently spread over the first inorganic film 232 due to the high viscosity of the raw-material fluid or low affinity of the raw-material fluid to the first inorganic film 232, the first inorganic film 232 may be exposed from the raw-material fluid on the display region 106. Furthermore, in the case where a foreign object 232 is attached to the peripheral region, the foreign object cannot be sufficiently covered with the organic film 234 as shown in FIG. 13. As a result, a pinhole is generated in the second inorganic film 236 formed over the organic film 234 (see the arrow in the enlarged figure in FIG. 13), which causes the entrance of impurities.

On the other hand, the guide 260 provides a minute uneven structure in the peripheral region. Moreover, the interval S between the adjacent guide insulating films 262 is equal to or more than twice the thickness t of the first inorganic film 232 in each guide 260. Hence, the uneven structure caused by the plurality of guide insulating films 262 included in the guide 260 is reflected on the first inorganic film 232 formed over the guide 260. As a result, a plurality of fine grooves is formed on the top surface of the first inorganic film 232 (FIG. 12B).

Figure 14A:
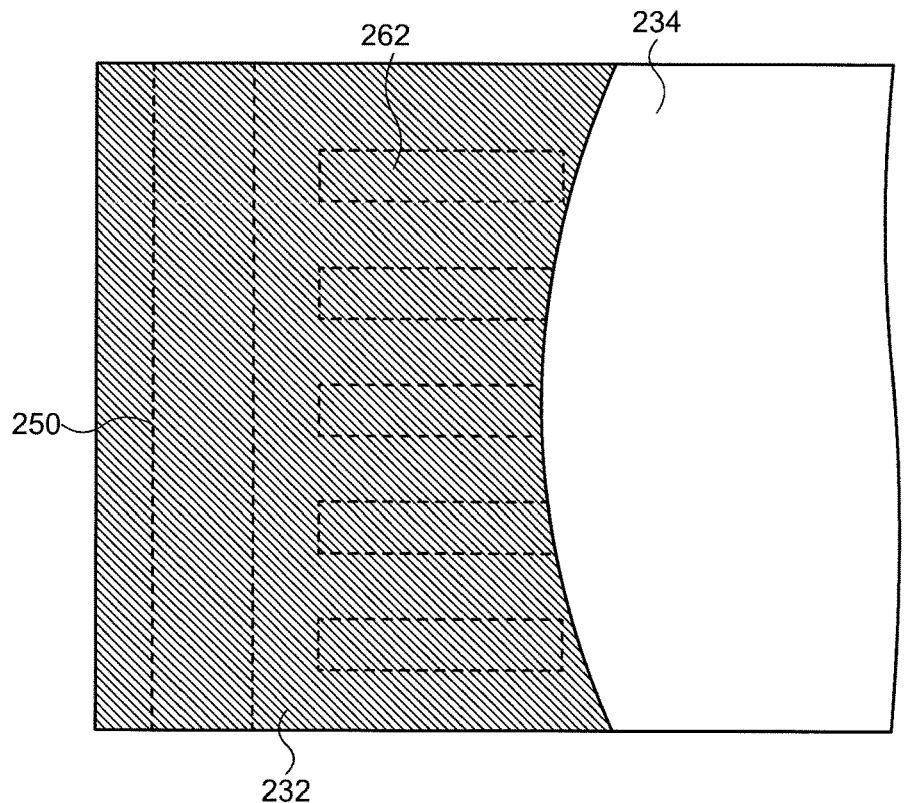
FIG. 14A and FIG. 14B are each a schematic top view showing a state of a passivation film in manufacturing a display device according to an embodiment of the present invention.
Figure 14B:
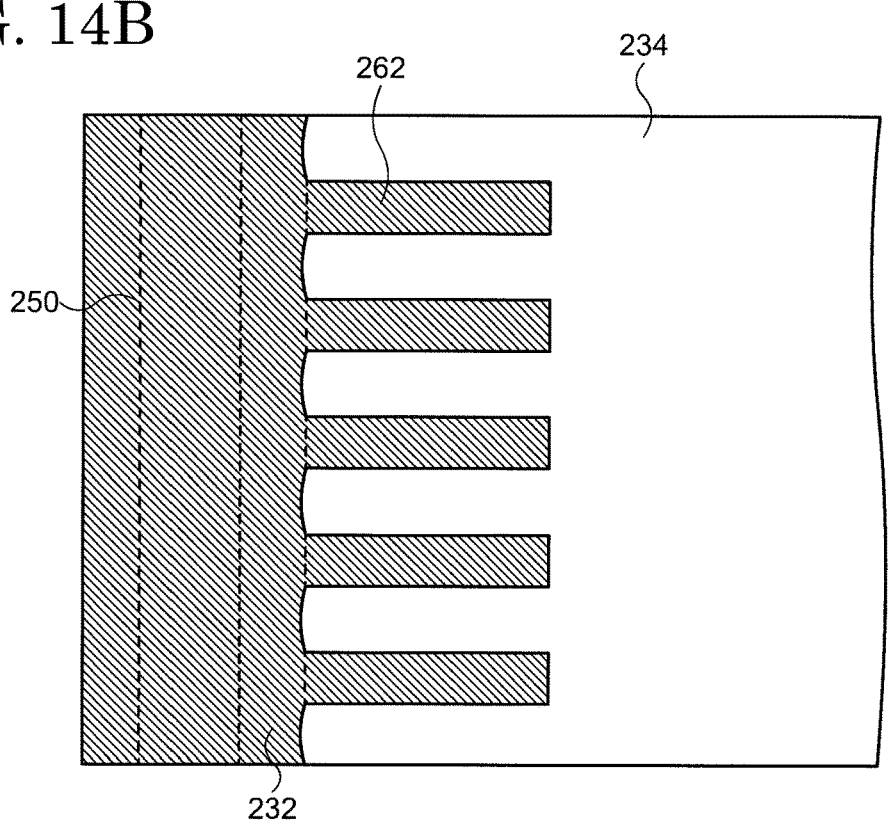

In the peripheral region having such an uneven structure, once the raw-material fluid, which provides the organic film 234 and is discharged or applied on the first inorganic film 232, comes into contact with an edge of the guide 260 (FIG. 14A), the raw-material fluid passes in the grooves and spreads to the other edge due to the capillary phenomenon induced by the guide insulating films 262 arranged with the interval S (FIG. 14B). Hence, it is possible to spread the raw-material fluid applied on the inorganic film 232 to the region in which the guide 260 is formed. When the organic film 234 is formed so as to cover the first dam 250-1 and the second region 282, the second guide 260-2 is prepared in the second region 282, by which the raw-material fluid can be sufficiently spread to the edge portion of the second guide 260-2 with the grooves of the first inorganic film 232 caused by the second guide 260-2. Through this mechanism, the organic film 234 can be selectively formed within the first dam 250-1 by forming the first guide 260, whereas the organic film 234 can be selectively formed within the first dam 250-1 or the second dam 250-2 by forming the first guide 260-1 and the second guide 260-2. In addition, a flat surface required by the second inorganic film 236 can be sufficiently secured. Accordingly, even if a foreign object is attached to the peripheral region, not only can the foreign object be sufficiently covered with the organic film 234 but also the generation of deficiencies such as a pinhole in the second inorganic film 236 can be prevented. These efficacies contribute to the production of a display device with high reliability.

Similarly, the third guide 260-3 and the fourth guide 260-4 are effective for shape control of the resin film 240. Similar to the first guide 260-1 and the second guide 260-2, the third guide 260-3 and the fourth guide 260-4 provide a minute uneven structure in the peripheral region. As described below, the third guide 260-3 and the fourth guide 260-4 are covered with the first inorganic film 232 and the second inorganic film 236 over which the raw-material fluid providing the resin film 240 is discharged or applied during the manufacturing process of the display device 100. Hence, although not illustrated, this uneven structure is reflected on the second inorganic film 236, and a plurality of fine grooves on the top surface of the second inorganic film 236.

Thus, once the raw-material fluid providing the resin film 240 comes into contact with an edge of the groove caused by the third insulating film 262-3 or the fourth guide insulating film 262-4, the raw-material fluid passes in the grooves and spreads to the other edge due to the capillary phenomenon. Hence, it is possible to sufficiently spread the raw-material fluid to the region where the third guide 260-3 or the fourth guide 260-4 is formed. In other words, the formation of the third guide 260-3 or the fourth guide 260-4 allows the resin film 240 to be selectively formed within the third dam 250-3 or the fourth dam 250-4. As a result, the display region 106 and the passivation film 230 formed thereover can be adequately sealed and protected with the resin film 240. Moreover, the resin film 240 also functions as an etching mask for the first inorganic film 232 and the second inorganic film 236. Therefore, the third guide 260-3 and the fourth guide 260-4 also contribute to the precise control of the shapes of the first inorganic film 232 and the second inorganic film 236.

4. Modified Example

The arrangement and the shape of the guide insulating films 262 in each guide 260 are not limited to those described above. Other examples for the arrangement and the shape of the guide insulating films 262 are shown in FIG. 15A to FIG. 15D.

Figure 15A:
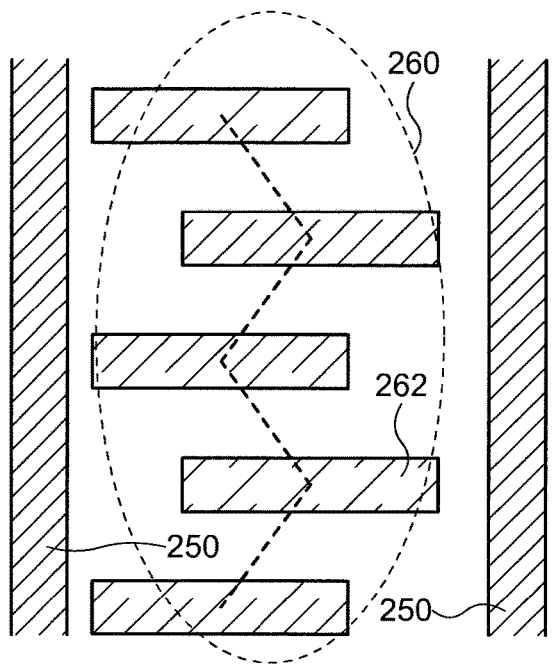
FIG. 15A to FIG. 15D are each a schematic top view of a guide of a display device according to an embodiment of the present invention.

As shown in FIG. 15A, the guide insulating films 262 may be arranged to take a staggered arrangement. That is, the guide insulating films 262 may be arranged so that a straight line connecting the gravity center of each guide insulating film 262 (a dotted line in FIG. 15A) traces a zig-zag shape in the direction in which the guide 260 extends.

Figure 15B:
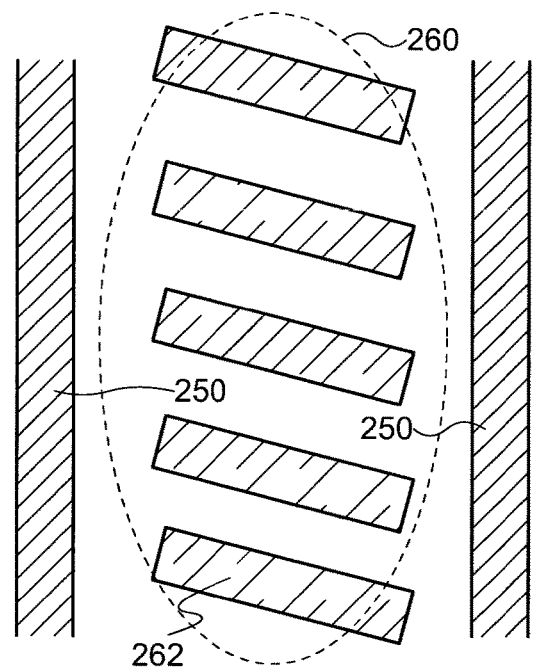
Figure 15C:
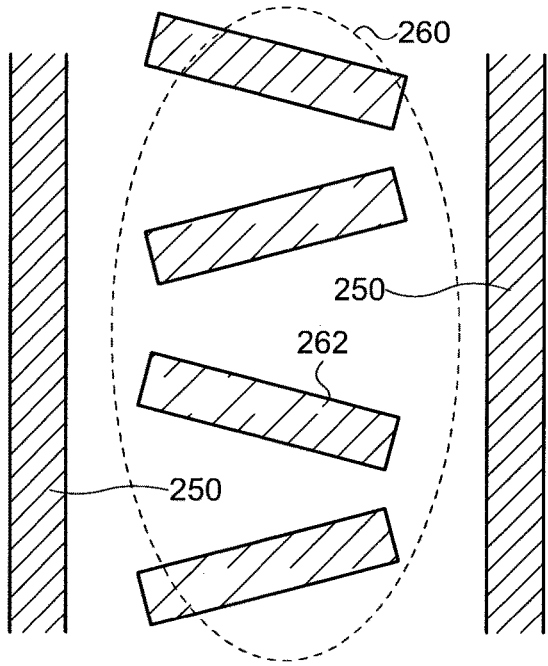

Alternatively, the guide insulating films 262 may be arranged so that the longest sides of all of or a part of the guide insulating films 262 in each guide 260 are inclined with respect to the direction in which the side of the substrate 102 or the display region 106 closest to the longest sides as shown in FIG. 15B. In other words, the longest side of the guide insulating film 262 may be inclined with respect to the direction in which the guide 260 extends. In this case, a pair of adjacent guide insulating films 262 may be arranged so that the incline directions are opposite to each other or may be linear-symmetrically arranged with respect to an axis perpendicular to the direction in which the guide 260 extends as shown in FIG. 15C, for example.

Figure 15D:
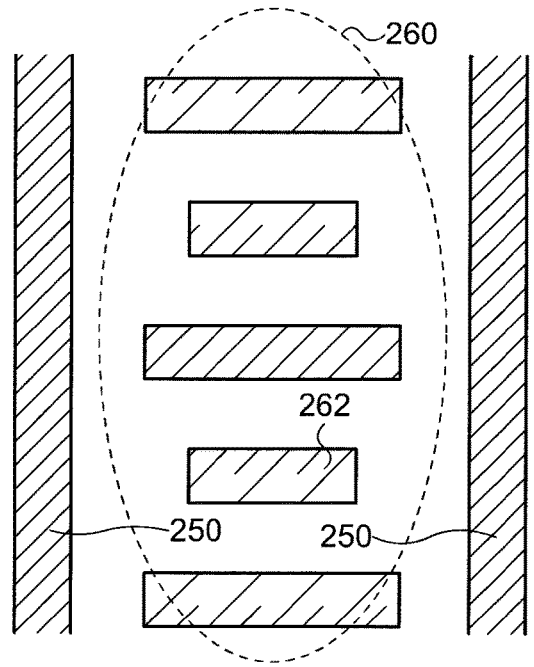

Alternatively, it is not necessary for all of the guide insulating films 262 to have the same length in each guide 260, and at least a part thereof may be different in length from the others as shown in FIG. 15D.

As described above, the capillary phenomenon takes place for the raw-material fluids providing the organic film 234 and the resin film 240 due to the uneven structure caused by the guide 260 in the display device 100. Hence, even in the case where the raw-material fluid is hard to spread over the first inorganic film 232 and the second inorganic film 236 due to the high viscosity of the raw-material fluid or a high contact angle of the raw-material fluid resulting from the low affinity of the raw-material fluid to the surface to be treated, the display region 106 and the periphery region can be sufficiently covered with the organic film 234 and the resin film 240, and the influence of a foreign object can be effectively excluded. As a result, it is possible to adequately seal the display device 100 and provide high reliability thereto.

Second Embodiment

In the present embodiment, a display device which is different from the display device 100 in the arrangement of the guide insulating film 262 is explained. An explanation for the structures the same as or similar to those of the First Embodiment may be omitted.

1. Structure of Guide Insulating Film

Figure 16:
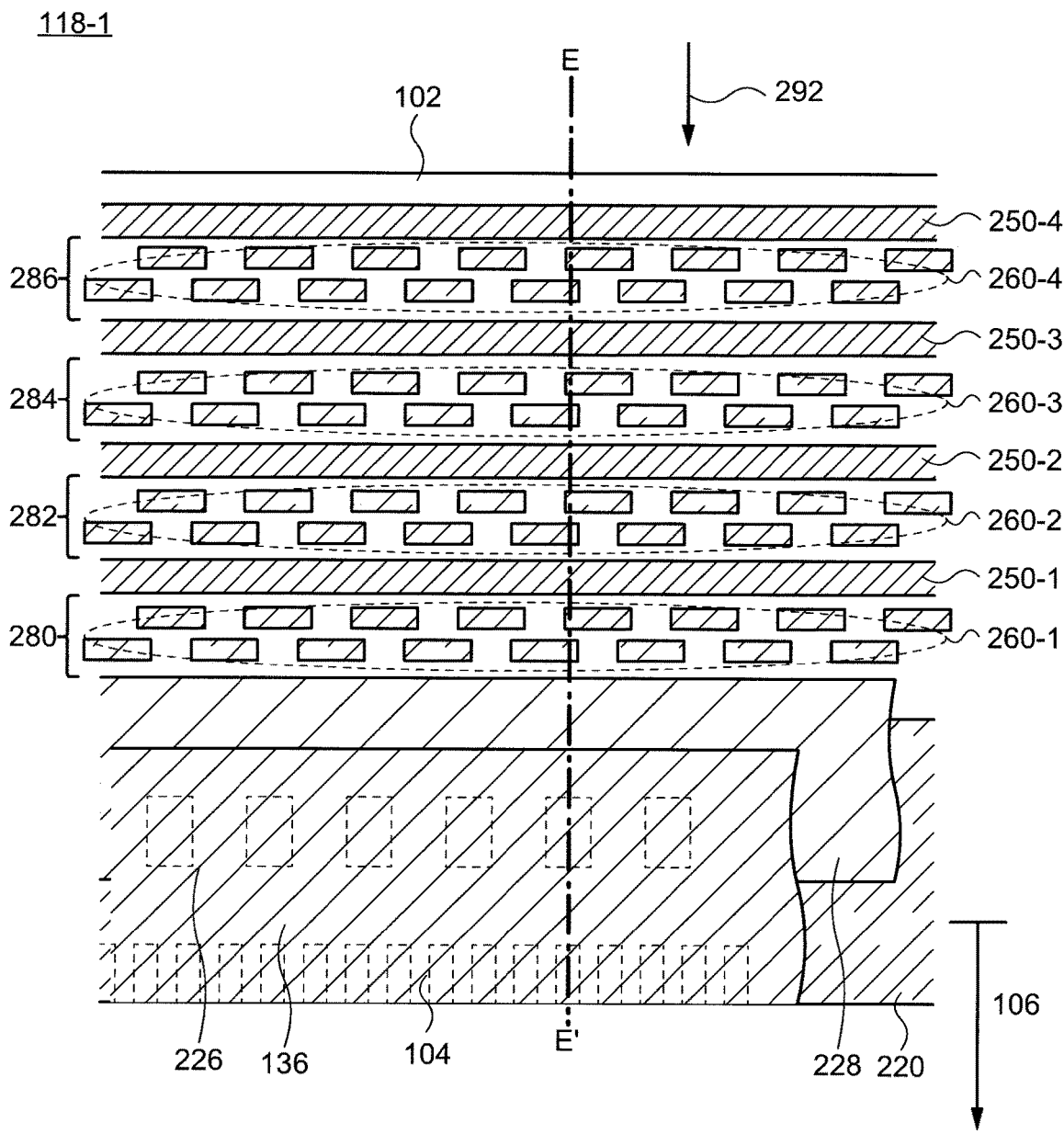
FIG. 16 is a schematic top view of a display device according to an embodiment of the present invention.
Figure 17:
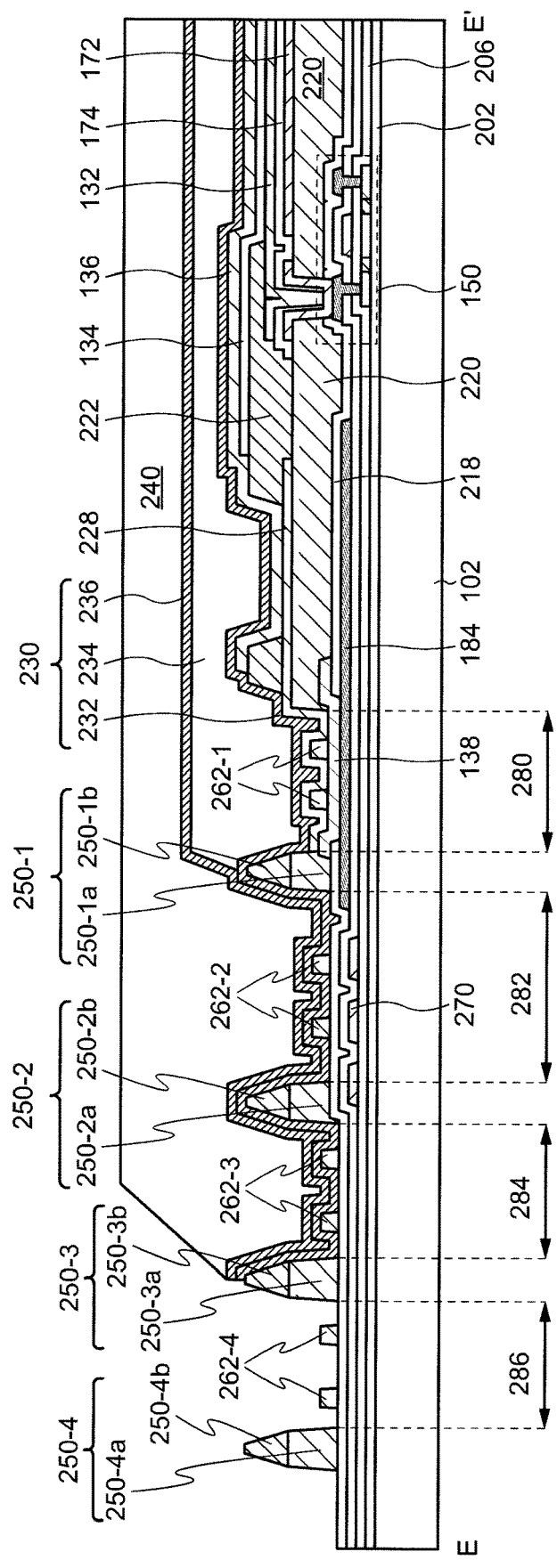
FIG. 17 is a schematic cross-sectional view of a display device according to an embodiment of the present invention.

A difference between the display device according to the present embodiment and the display device 100 is that the longest side of the guide insulating film 262 of each guide 260 is parallel to or substantially parallel to the direction in which the side of the display region 106 (or the substrate 102) closest to the guide insulating film 262 extends. A specific example is demonstrated in a schematic top view of the region 118-1 (FIG. 16) and a schematic cross-sectional view (FIG. 17) along a chain line E-E' in FIG. 16. As shown in FIG. 16, the plurality of guide insulating films 262 takes a staggered arrangement in each guide 260. Hence, in one guide 260, the plurality of guide insulating films 262 are arranged in two lines along the extending direction of the guide 260, and a line connecting the gravity centers of the guide insulating films 262 has a zig-zag structure (FIG. 16 and FIG. 17). When focus is placed on one line, a distance between the adjacent guide insulating films 262 is shorter than the longest side of the guide insulating film 262. In addition, the space between the adjacent guide insulating films 262 in one line is blocked by the guide insulating film 262 in the other line when observed in a direction (the direction of an arrow 292) parallel to the main surface of the substrate 102. An explanation of other structures is omitted because they are the same as those of the display device 100.

Figure 18:
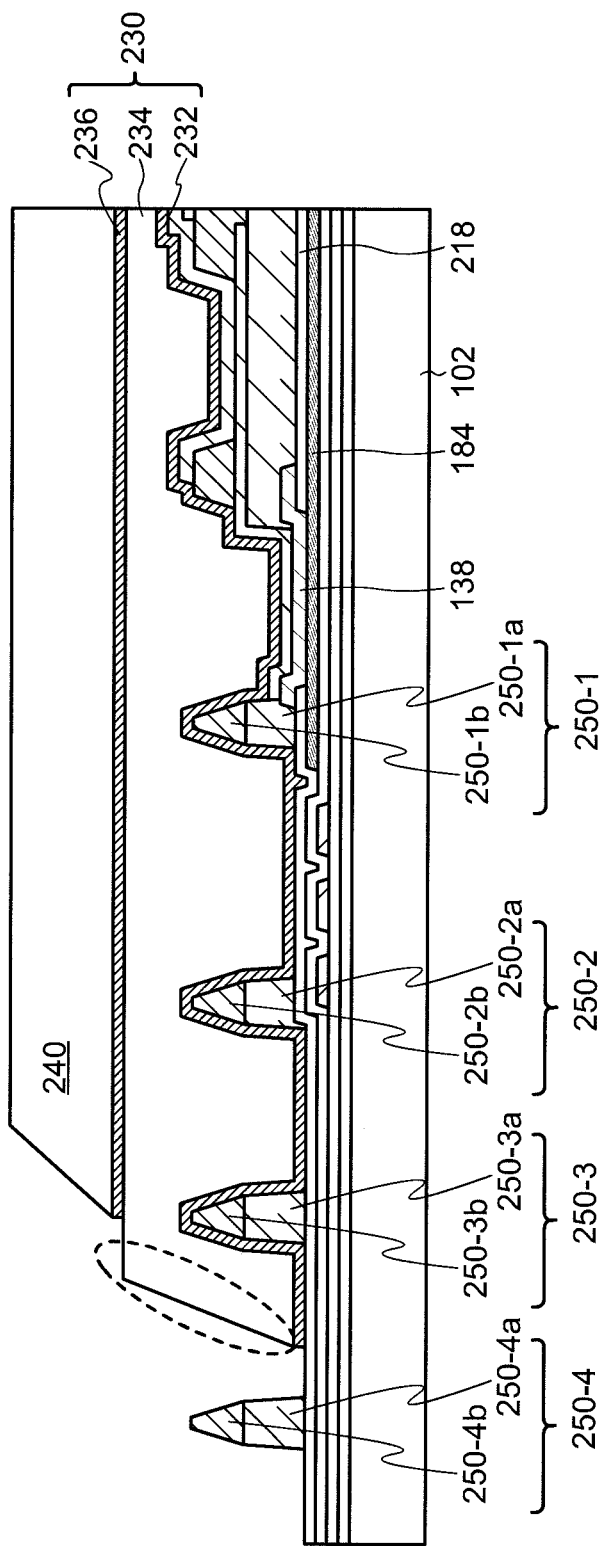
FIG. 18 is a schematic cross-sectional view for explaining an example of a manufacturing process of a traditional display device.

In the case where the viscosity of the raw-material fluid used for forming the organic film 234 or the resin film 240 is low or in the case where the affinity of the raw-material fluid to the surface to be treated (i.e., the first inorganic film 232, the second inorganic film 236 and the like) is high, the raw-material fluid may excessively spread. For example, in the case where the raw-material fluid providing the organic film 234 flows over the third dam 250-3 toward the edge portion side of the substrate 102, the organic film 234 is exposed from the second inorganic film 236 and the resin film 240 formed thereover as shown in FIG. 18. As a result, impurities readily enter the organic film 234, and the passivation film 230 loses its function.

Figure 19:
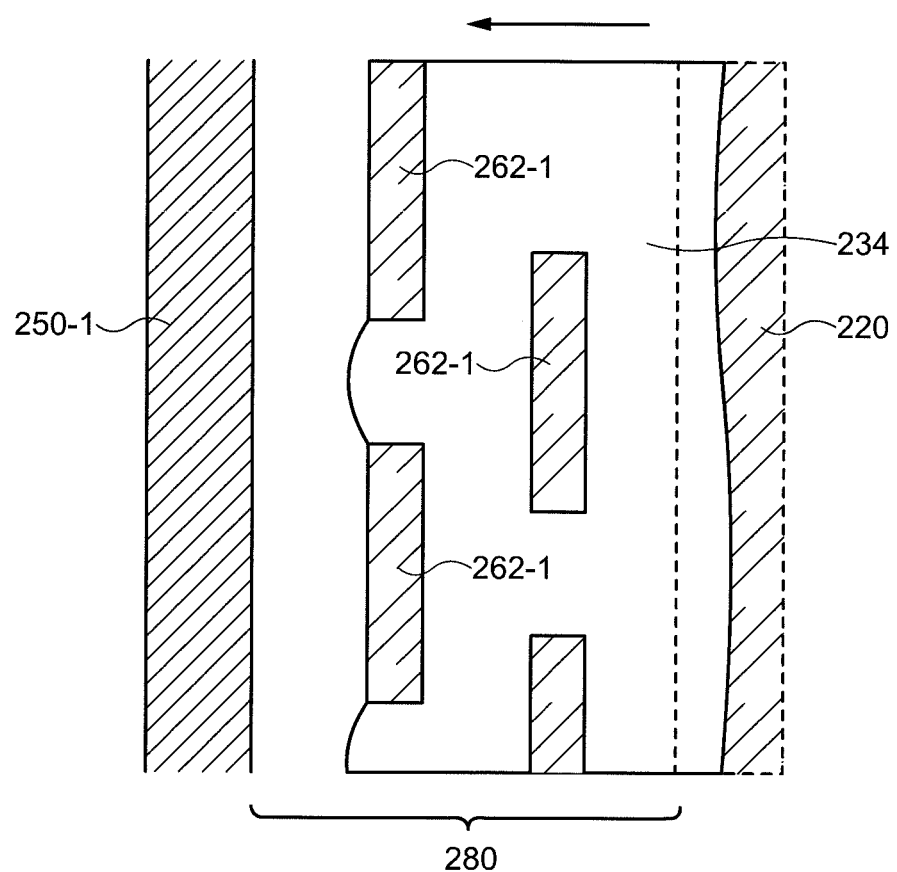
FIG. 19 is a schematic top view showing a state of a passivation film in manufacturing a display device according to an embodiment of the present invention.

However, when the guide 260 having the aforementioned arrangement is provided, the guide insulating films 262 allow the raw-material fluid to spread in the direction in which the guide 260 extends and to be dammed in the direction perpendicular to the direction in which the guide 260 extends. Sticking to the example of the first region 280 sandwiched by the leveling film 220 and the first dam 250-1, the raw-material fluid flowing over the leveling film 220 is dammed with the first guide insulating film 262-1 because the first guide insulating films 262-1 extend perpendicularly to the travelling direction (the direction of the arrow in the drawing) of the raw-material fluid as shown in FIG. 19. At the same time, the raw-material fluid spreads in the direction (the direction perpendicular to the arrow in the drawing) in which the guide 260 extends. Accordingly, the organic film 234 can be selectively formed within the first dam 250-1.

Although not illustrated, even when the raw-material fluid flows over the first guide 260-1 or the first dam 250-1, the raw-material fluid is also dammed with the second guide insulating films 262-2 and does not flow over the second dam 250-2 because the second guide 260-2 having the same arrangement is also provided in the second region 282. Thus, the organic film 234 can be selectively formed within the second dam 250-2. The shape and position of the organic film 234 can be precisely controlled on the basis of this mechanism.

The same mechanism also functions when the resin film 240 is formed. That is, when the raw-material fluid providing the resin film 240 overflows the third dam 250-3 toward the edge portion of the substrate 102, raw-material fluid is dammed with the fourth guide insulating films 262-4 of the fourth guide 260-4 to prevent the raw-material fluid from flowing over the fourth dam 250-4. When the resin film 240 is formed so that the edge portion thereof is positioned between the second dam 250-2 and the third dam 250-3, the third guide insulating films 262-3 prevent the raw-material fluid from overflowing across the third dam 250-3. With this mechanism, the shape and position of the resin film 240 are precisely controlled.

2. Modified Example

Figure 20A:
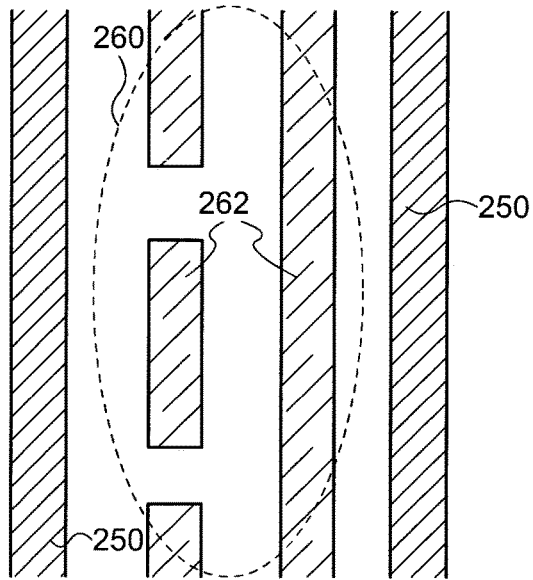
FIG. 20A to FIG. 20C are each a schematic top view of a guide of a display device according to an embodiment of the present invention.

In the present embodiment, the arrangement and the shape of the guide insulating films 262 in each guide 260 are not limited to those described above. For example, each guide 260 may be configured so that each guide 260 has the plurality of guide insulating films 262 arranged in two lines and the guide insulating films forming one of the lines are integrated to be a single insulating film surrounding the display region 106 as shown in FIG. 20A. In this case, the guide insulating film 262 formed as a single insulating film may be close to or far from the plurality of guide insulating films 262 forming the other line in each guide 260.

Figure 20B:
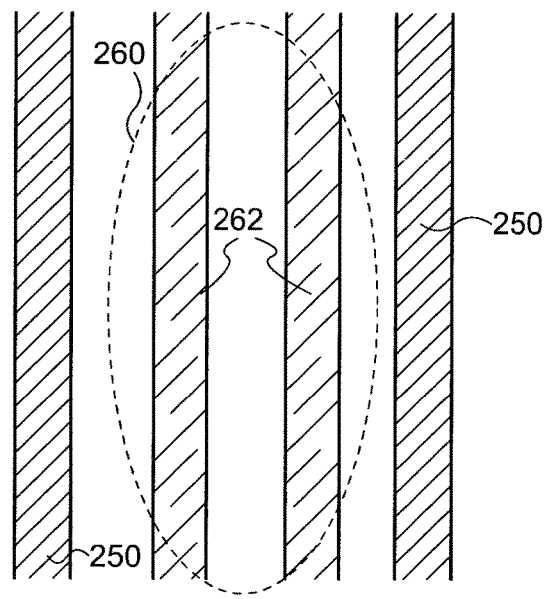
Figure 20C:
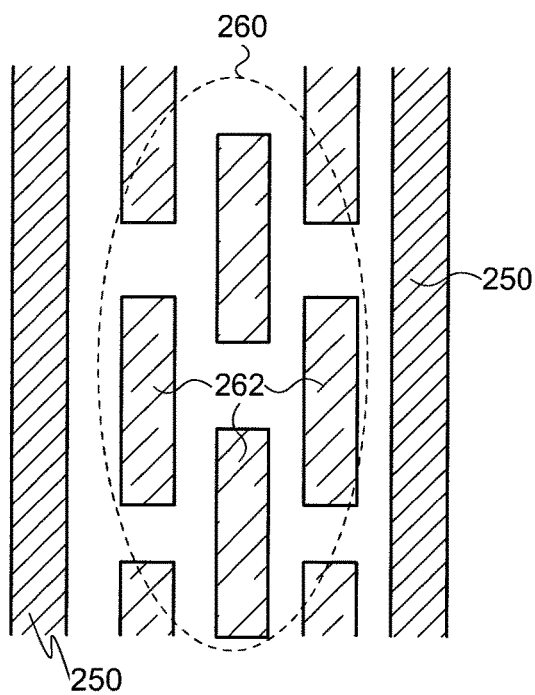

Alternatively, each guide 260 may be structured by a single guide insulating film 262 surrounding the display region 106 and a single guide insulating film 262 surrounding the former one as shown in FIG. 20B. Alternatively, the guide insulating films 262 may be arranged in three or more lines in the direction in which the guide 260 extends as shown in FIG. 20C. In this case, when focus is placed on two adjacent lines, it is preferred to configure the guide 260 so that the plurality of guide insulating films 260 exists in a staggered arrangement.

Note that, although FIG. 20A to FIG. 20C demonstrate the guide 260 sandwiched by two adjacent dams 250, these modified examples can be applied to the guide 260 sandwiched by the leveling film 220 and the first dam 250-1.

Third Embodiment

In the present embodiment, a display device having the arrangement and the shape of the guide insulating films 262 different from those described in the First and Second Embodiments is explained. An explanation of the structures the same as or similar to those of the First and Second Embodiments may be omitted.

Figure 21A:
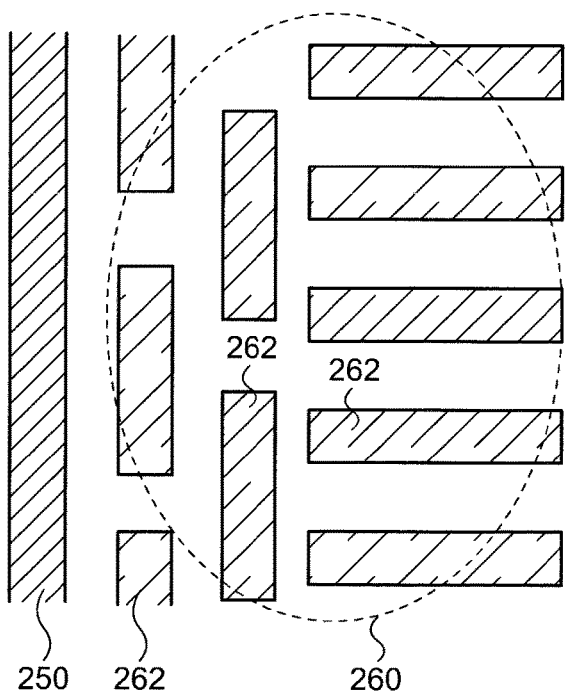
FIG. 21A to FIG. 21D are each a schematic top view of a guide of a display device according to an embodiment of the present invention.
Figure 21B:
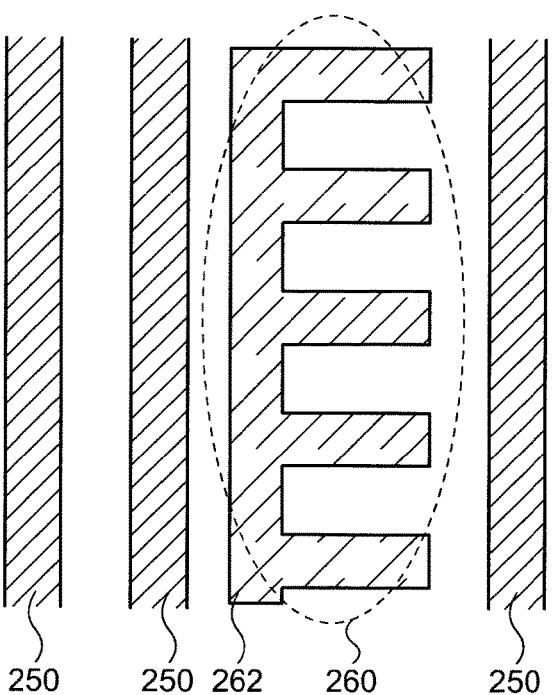
Figure 21C:
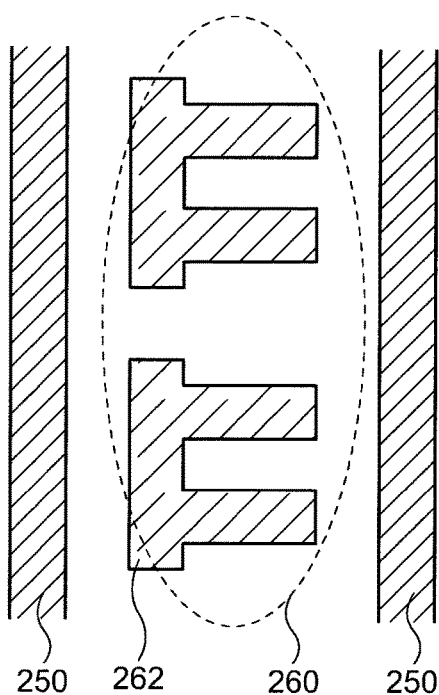
Figure 21D:
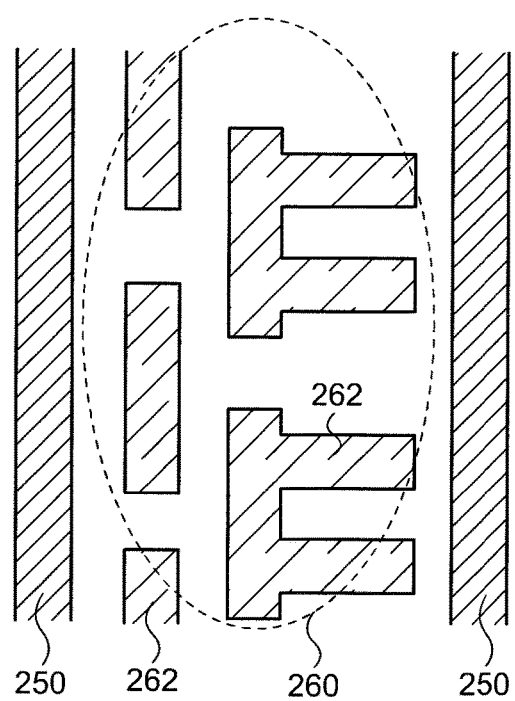
Figure 22:
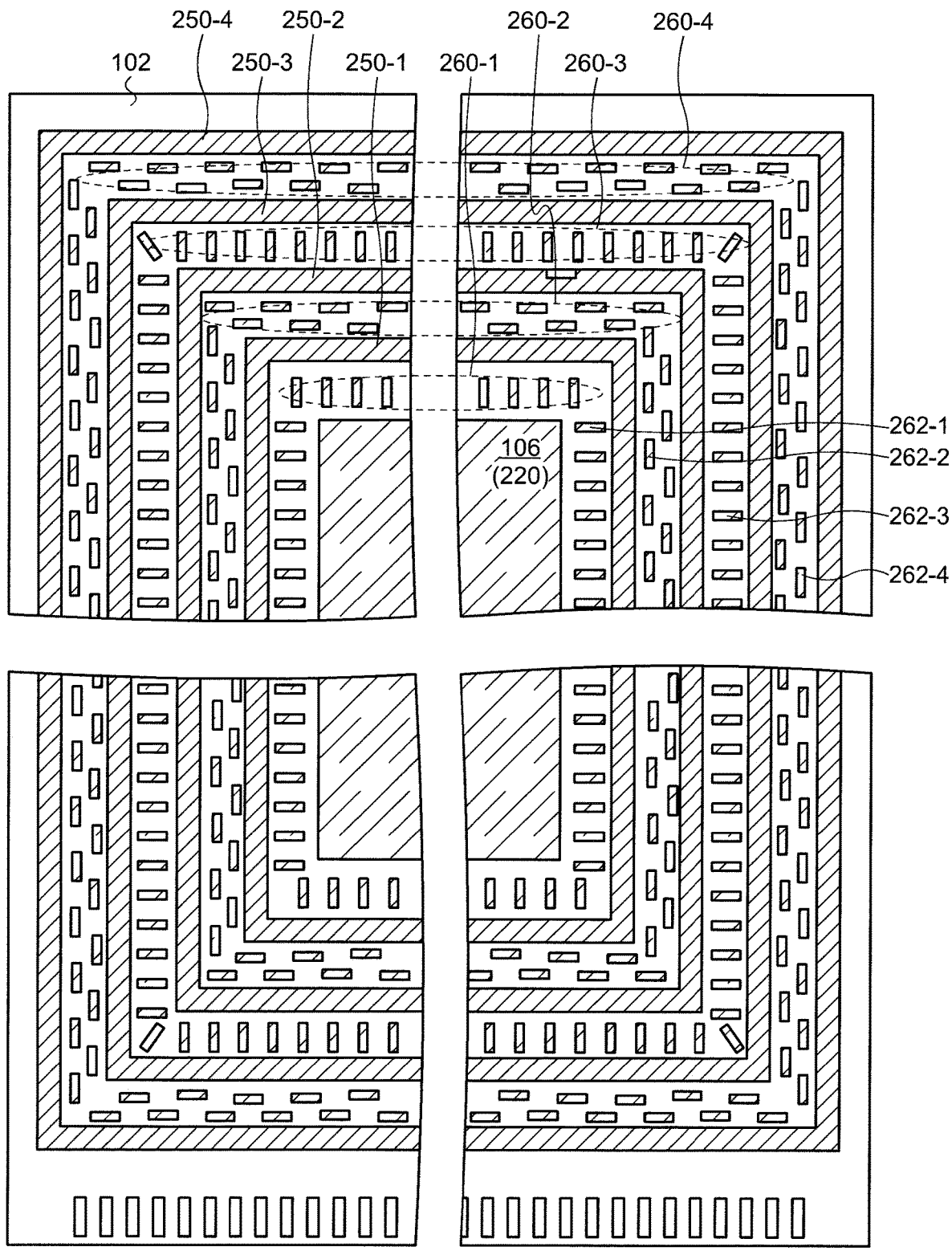
FIG. 22 is a schematic top view of a display device according to an embodiment of the present invention.

Arrangement examples of the guide insulating films 262 of the display device according to the present embodiment are demonstrated in FIG. 21A to FIG. 22. In the display device according to the present embodiment, each guide 260 has the guide insulating films 262 whose longest sides are parallel to or substantially parallel to the direction in which the side of the display region 106 (or the substrate 102) extends as well as the guide insulating films 262 whose longest sides are perpendicular to or substantially perpendicular to the direction.

As shown in FIG. 21A, for example, each guide 260 has the plurality of guide insulating films 262 arranged in three lines, and the longest sides of the guide insulating films 262 in one of the lines are perpendicular to or substantially perpendicular to the direction in which the side of the display region 106 (or the substrate 102) closest thereto extends. On the other hand, the longest sides of the guide insulating films 262 in the other two lines are parallel to or substantially parallel to the direction in which the side of the display region 106 (or the substrate 102) closest thereto extends. In the latter lines, the plurality of guide insulating films 262 may have a staggered arrangement. The guide insulating films 262 arranged in the former one line promotes the spread of the raw-material fluids providing the organic film 234 and the resin film 240, while the guide insulating films 262 arranged in the latter two lines suppress the excessive spread of the raw-material fluids. Accordingly, the organic film 234 and the resin film 240 can be selectively formed in a desired region.

Alternatively, each guide 260 may include one or a plurality of comb-shaped guide insulating films 262 as shown in FIG. 21B and FIG. 21C. The comb-shaped guide insulating films 262 also surround the display region 106. The comb-shaped guide insulating film 262 simultaneously has a portion perpendicular to the extending direction of the side of the display region 106 (or the substrate 102) closest thereto and a portion parallel to the extending direction. The spread of the raw-material fluid is promoted by the former, whereas the latter prevents the raw-material fluid from excessively spreading. Accordingly, the organic film 234 and the resin film 240 can be selectively formed in a desired region.

Moreover, the guide 260 may be configured so as to have one or the plurality of comb-shaped guide insulating films 262 as well as the plurality of guide insulating films 262 whose longest sides are arranged parallel to the direction in which the side of the display region 106 (or the substrate 102) closest thereto extends as shown in FIG. 21D. The spread of the raw-material fluid is promoted by the portions of the comb-shaped guide insulating films 262 perpendicular to the extending direction of the side of the display region 106 (or the substrate 102) closest thereto. On the other hand, the excessive spread of the raw-material fluid is suppressed by the residual portions of the comb-shaped guide insulating films 262 and the plurality of guide insulating films 262 whose longest sides are arranged parallel to the direction in which the side of the display region 106 (or the substrate 102) closest thereto extends.

Alternatively, the plurality of guides 260 may be configured so that the guides 260 having different arrangements of the guide insulating films 262 alternate as shown in FIG. 22. In the example demonstrated in FIG. 22, the first guide insulating films 262-1 and the third guide insulating films 262-3 respectively included in the first guide 260-1 and the third guide 260-3 are arranged so that the longest sides thereof are perpendicular to or substantially perpendicular to the direction in which the side of the display region 106 (or substrate 102) closest thereto extends. On the other hand, the second guide insulating films 262-2 and the fourth guide insulating films 262-4 respectively included in the second guide 260-2 and the fourth guide 260-4 are arranged so that the longest sides thereof are parallel to or substantially parallel to the direction in which the side of the display region 106 (or substrate 102) closest thereto extends.

The formation of the plurality of guides 260 having these arrangements enables the shape and position of the organic film 234 and the resin film 240 to be more precisely controlled. That is, the first guide 260-1 and the second guide 260-2 respectively realizes the promotion of the spread and the suppression of the excessive spread of the raw-material fluid providing the organic film 234. Similarly, the third guide 260-3 and the fourth guide 260-4 respectively realizes the promotion of the spread and the suppression of the excessive spread of the raw-material fluid providing the resin film 240.

As described in the present embodiment, formation of a guide, in which guide insulating films having a function to promote the spread of a raw-material fluid providing a film formed with a wet-type film-formation method and guide insulating films having a function to suppress its spread coexist, enables precise control of the shape and position of the resulting film.

Fourth Embodiment

In the present embodiment, a manufacturing method of the display device 100 described in the First Embodiment is explained using FIG. 6 and FIG. 23A to FIG. 27. FIG. 23A to FIG. 27 are schematic cross-sectional views corresponding to FIG. 6. An explanation of the structures the same as or similar to those of the First to Third Embodiments may be omitted.

A structure is shown in FIG. 23A in which the driving transistor 150 and the second interlayer film 218 are formed. An explanation is omitted since this structure can be fabricated by applying the known methods.

1. Formation of Leveling Film and Guide

As shown in FIG. 23B, the second interlayer film 218 is subjected to etching processing to form an opening in the second interlayer film 218 for electrical connection of the first connection wiring 138 with the low-potential power-source wiring 184. After that, the first connection wiring 138 is formed over the second interlayer film 218 so as to cover this opening (FIG. 23C). The first connection wiring 138 may be formed by applying a sputtering method, a chemical vapor deposition (CVD) method or the like.

Figure 24A:
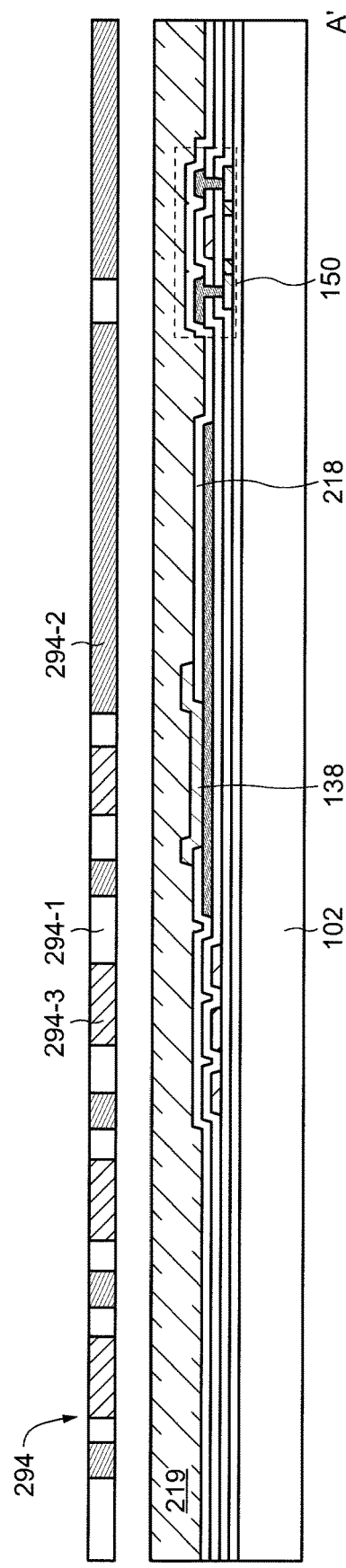
FIG. 24A and FIG. 24B are each a schematic cross-sectional view for explaining a manufacturing method of a display device according to an embodiment of the present invention.

Thereafter, a photo-sensitive resin 219 is formed over the entire surface of the substrate 102 so as to cover the pixel circuit including the driving transistor 150 and the peripheral region as shown in FIG. 24A. This photo-sensitive resin 219 is a film providing the leveling film 220 and the first layers 250a of the dams 250. In the formation of the photo-sensitive resin 219, a solution or a suspension including an organic compound such as an acrylic resin, an epoxy resin, a polysiloxane resin, a polyimide resin, and a polyamide resin or a precursor thereof is first applied over the entire surface of the substrate 102 by applying a spin-coating method, a printing method, an ink-jet method, a dip-coating method or the like, and then the solvent is evaporatively removed. Alternatively, a sheet-shaped photo-sensitive resin 219 including the aforementioned organic compound or the precursor thereof is adhered.

Thereafter, a photomask 294 is arranged over the substrate 102, and the photo-sensitive resin 219 is irradiated with light. The photomask 294 is a so-called gray-tone mask or a half-tone mask having a light-transmitting portion 294-1, a light-shielding portion 294-2, and a semi-translucent portion 294-3. The light-transmitting portion 294-1 has transmissivity equal to or higher than 75% and equal to or less than 100% or equal to or higher than 80% and equal to or less than 100% with respect to the light (irradiating light) used for light exposure. The transmissivity of the light-shielding portion 294-2 is equal to or higher than 0% and equal to or less than 5%, equal to or higher than 0% and equal to or less than 2%, equal to or higher than 0% and equal to or less than 1%, or substantially 0% with respect to the irradiating light, for example. The transmissivity of the semi-translucent portion 294-3 is equal to or higher than 20% and equal to or less than 60%, equal to or higher than 30% and equal to or less than 50%, or typically 40%.

When the photo-sensitive resin 219 is a positive-type resin, the photomask 294 is designed and arranged so that the regions in which the leveling film 220 and the first layers 250a of the dams 250 are to be formed are covered by the light-shielding portion 294-2, the regions in which the guides 260 are to be formed are covered by the light-translucent portion 294-3, and the residual regions (that is, a region in which the photo-sensitive resin 219 is completely removed) are covered by the light-transmitting portion. 294-1. On the other hand, when the photo-sensitive resin 219 is a positive-type resin, the photomask 294 is designed and arranged so that the regions in which the leveling film 220 and the first layers 250a of the dams 250 are to be formed are covered by the light-transmitting portion 294-1, the regions in which the guides 260 are to be formed are covered by the light-translucent portion 294-3, and the residual regions are covered by the light-transmitting portion 294-2. Light exposure is carried out while the photomask 294 is arranged in this manner, and then a development treatment is performed, by which the leveling film 220, the first layers 250a of the dams 250, and the guide insulating films 262 are formed.

When the photo-sensitive resin 219 is a positive-type resin, the height of the photo-sensitive resin 219 is maintained substantially unchanged in the unexposed portions, that is, the regions covered by the light-shielding portion 294-2 because the low solubility of the photo-sensitive resin 219 with respect to an etchant is maintained. On the other hand, only a part of the photo-sensitive resin 219 is exposed, and the solubility increases in the semi-exposed portions, that is, the regions covered by the light-translucent portion 294-3. As a result, the exposed portions are dissolved in the etchant, and the other portions are left. Thus, the heights of leveling film 220 and the first layers 250a of the dams 250, which correspond to the unexposed portions, are the same as or substantially the same as the height of the photo-sensitive resin 219 prior to the exposure, while the heights of the guides 260 corresponding to the semi-exposed portions are smaller than that of the photo-sensitive resin 219 prior to the exposure. As a result, the guide insulating films 262 lower than the leveling film 220 and the first layers 250 are obtained.

The same is applied to the case where the photo-sensitive resin is a negative-type resin. The photo-sensitive resin 219 is not dissolved in the regions covered by the light-transmitting portion 294-1, and the height of the photo-sensitive resin 219 remains substantially unchanged because the solubility with respect to the etchant drastically decreases. On the other hand, since a part of the photo-sensitive resin 219 is exposed, the part is dissolved in the etchant and the other portion remains in the regions covered by the semi-translucent portion 294-3. As a result, the heights of the guides 260 corresponding to the exposed portions are smaller than that of the photo-sensitive resin 219 prior to the exposure, while the heights of the leveling films 220 and the first layers 250a of the dams 250 corresponding to the semi-exposed portions are the same as or substantially the same as that of the photo-sensitive resin 219 prior to the exposure. With this process, the guide insulating films 262 lower than the leveling film 220 and the first layers 250a, which originate from the same photo-sensitive resin 219, can be obtained.

Figure 24B:
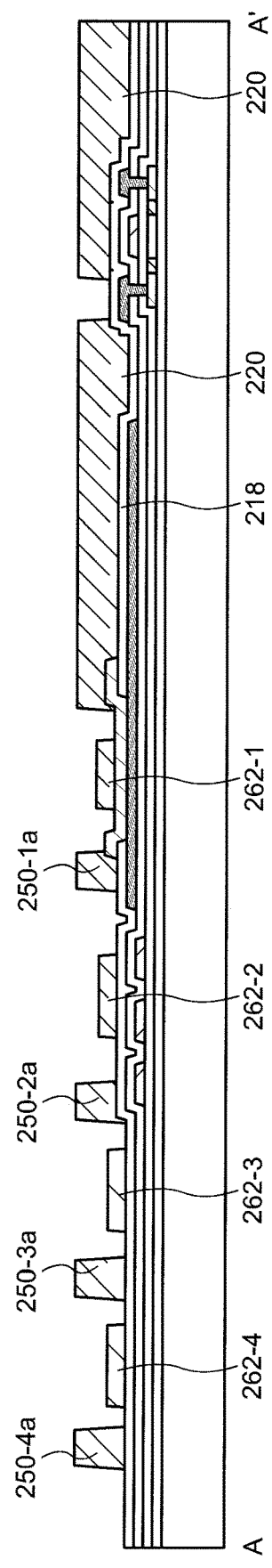

Note that, a part of the opening for the electrical connection between the driving transistor 150 and the display element 130 is formed in the leveling film 220 in this stage (FIG. 24B). In addition, the photo-sensitive resin 219 is also removed in the regions overlapping the terminals 112 to expose the terminals 112 (see FIG. 10) although not illustrated. After that, the second interlayer film 218 is further etched in this opening, thereby exposing the source electrode 216 from the leveling film 220 (FIG. 25A).

2. Formation of Display Element

Thereafter, the connection pad 224 is formed so as to cover the opening formed in the leveling film 220 and the second interlayer film 218, and the supplementary capacitor electrode 172 is formed to cover a part of an upper surface of the leveling film 220. These pads and the electrode may also be formed by applying a CVD method or a sputtering method. At this time, the protective conductive film 124 for protecting the wiring 122 may be formed over the terminals 112 (see FIG. 10).

Next, the third interlayer film 174 covering the supplementary capacitor electrode 172 and a part of the connection pad 224 is formed. Furthermore, the pixel electrode 132 is formed to overlap the supplementary capacitor electrode 172, and the second connection wiring 228 is formed to overlap a part of the leveling film 220 and the first connection wiring 138 (FIG. 25B). These films and the wiring may also be prepared by applying a CVD method or a sputtering method. The pixel electrode 132 and the second connection wiring 228 may exist in the same layer because they can be simultaneously formed.

Furthermore, the partition wall 222 and the second layers 250b of the dams 250 are formed so as to cover an edge portion of the pixel electrode 132 and the first layers 250a of the dams 250 (FIG. 25B). These items can also be prepared by applying a photo-sensitive resin over almost the entire surface of the substrate 102 and light-exposing the photo-sensitive resin using a photomask having a light-shielding portion and a light-transmitting portion, followed by developing the photo-sensitive resin. The opening 226 is also formed simultaneously at this time. The partition wall 222 and the second layers 250b of the dams 250 can exist in the same layer, have the same composition, and include the same organic compound by simultaneously forming these items in such a manner.

Figure 26A:
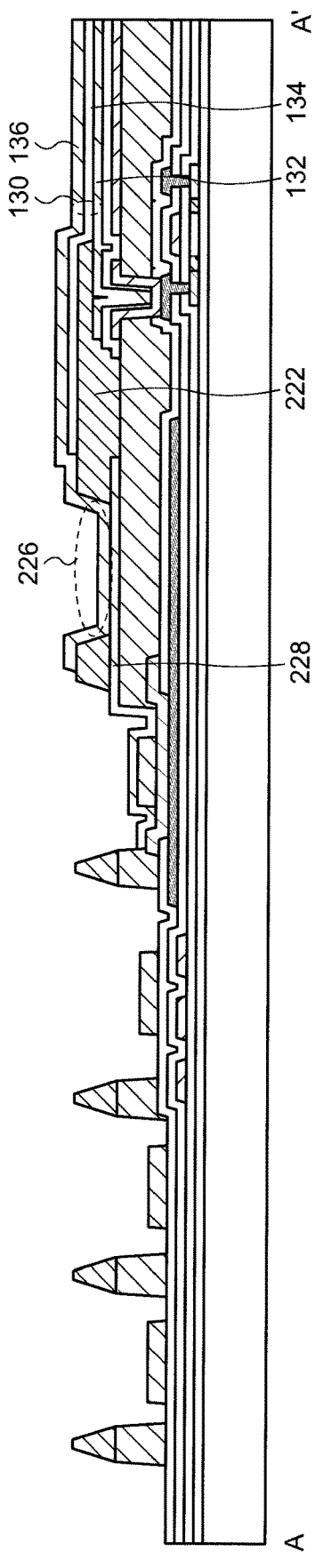
FIG. 26A and FIG. 26B are each a schematic cross-sectional view for explaining a manufacturing method of a display device according to an embodiment of the present invention.

After that, the EL layer 134 is formed so as to cover the partition wall 222 and the pixel electrode 132, and the counter electrode 136 is formed over the EL layer 134 (FIG. 26A). These items are formed using an evaporation method or a sputtering method in addition to a wet-type film-formation method such as an ink-jet method and a printing method. The counter electrode 136 is formed continuously from the display region 106 to the periphery region so as not only to cover the EL layer 134 but also to be connected to the second connection wiring 228 in the opening 226. Through the aforementioned processes, the display element 130 is fabricated.

3. Formation of Passivation Film

The first inorganic film 232 is formed over almost the entire surface of the substrate 102 by utilizing a CVD method. With this process, not only the display element 130 but also the dams 250 are covered by the first inorganic film 232 (FIG. 26B).

Figure 26B:
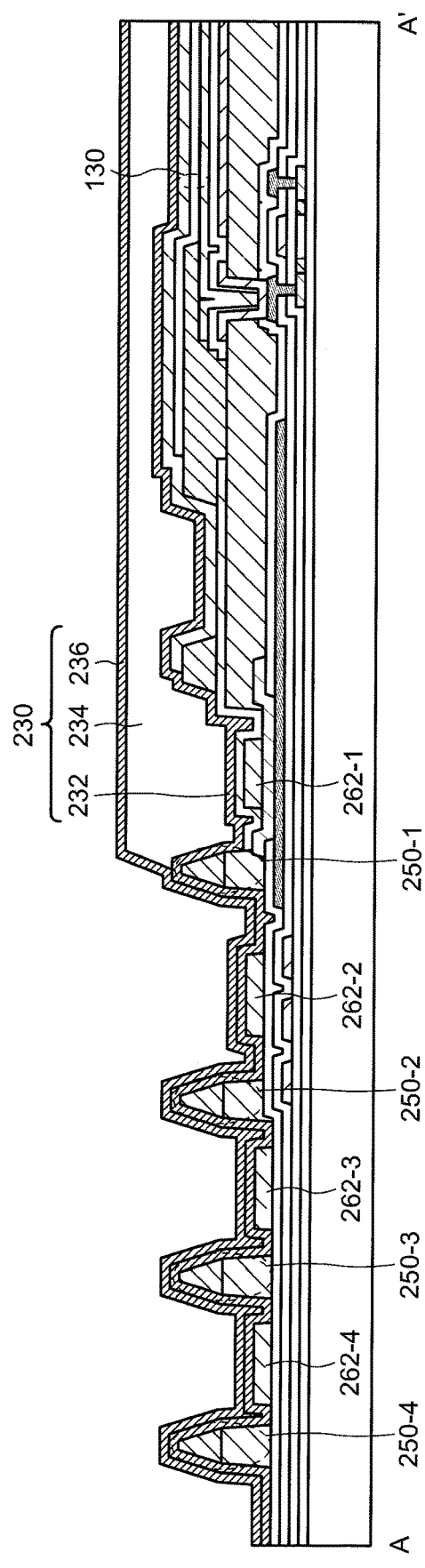

Thereafter, the organic film 234 is formed by utilizing an ink-jet method or a printing method (FIG. 26B). At least one guide 260 having the plurality of guide insulating films 262 is formed in the peripheral region of the display device 100. Hence, the mechanisms described in the First to Third Embodiments operate which enables the precise control of the shape and position of the organic film 234. In the example shown here, the organic film 234 is disposed so as to cover the first guide insulating films 262-1 and overlap a part of the first dam 250-1.

After that, the second inorganic film 236 is formed over the organic film 234 and the first inorganic film 232 by utilizing a CVD method. Since the second inorganic film 236 is also formed over almost the entire surface of the substrate 102, the first inorganic film 232 is in contact with the second inorganic film 236 over the third dam 250-3 and the fourth dam 250-4 (FIG. 26B). With this structure, the organic film 234 is sealed with the first inorganic film 234 and the second inorganic film 236, which prevents the entrance of impurities to the organic film 234 from the outside.

4. Formation of Resin Film

Figure 27:
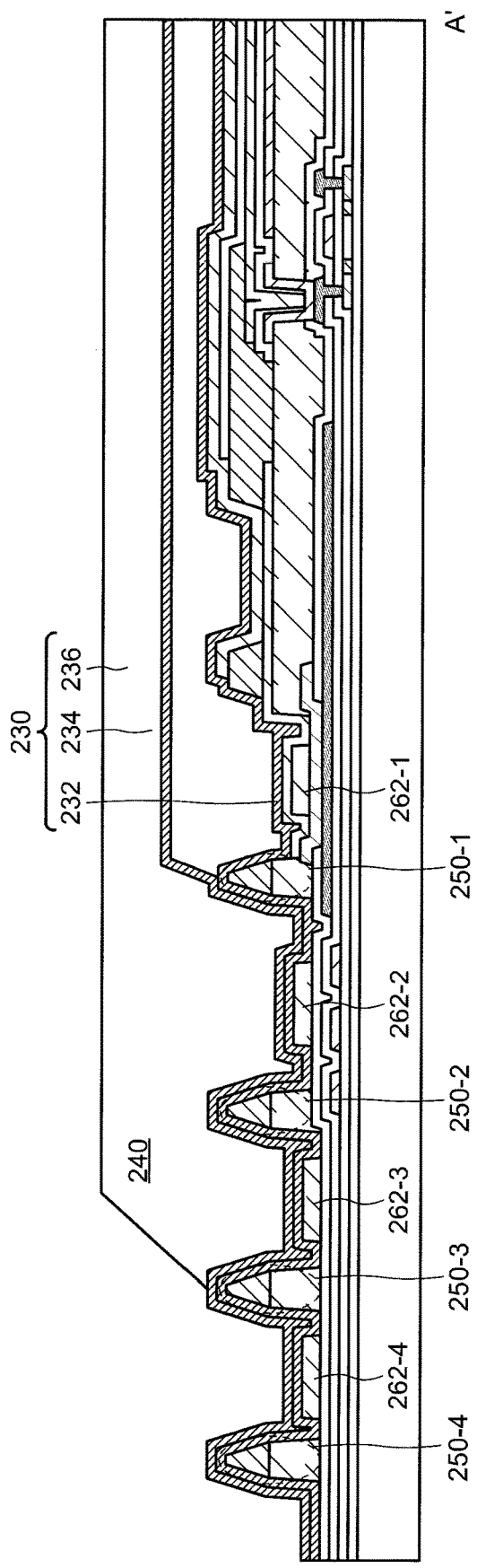
FIG. 27 is a schematic cross-sectional view for explaining a manufacturing method of a display device according to an embodiment of the present invention.

After that, the resin film 240 is formed (FIG. 27). The resin film is also formed from the raw-material fluid by utilizing an ink-jet method or a printing method. At least one guide 260 having the plurality of guide insulating films 262 is formed in the peripheral region of the display device 100. Hence, the mechanisms described in the First to Third Embodiments operate, which enables the precise control of the shape and position of the resin film 240. In the example shown here, the resin film 240 is formed so as to cover the first guide insulating films 262-1 to the third guide insulating films 262-3, the first dam 250-1, and the second dam 250-2 and to overlap a part of the third dam 250-3.

After that, etching processing is performed on the first inorganic film 232 and the second inorganic film 236 using the resin film 240 as a mask to partially remove the first inorganic film 232 and the second inorganic film 236 (FIG. 6). At this time, not only the fourth dam 250-4 and the fourth guide 260-4 are exposed but also the first inorganic film 232 and the second inorganic film 236 formed over the terminals 112 are removed (see FIG. 10). With this process, the wiring 122 or the protective conductive film 124 having conductivity is exposed, enabling the electrical connection with the connector 116. Through these processes, the display device 100 is manufactured.

As described above, implementation of the manufacturing method according to the present embodiment enables the production of the display device in which the shape and the position of the passivation film 230 and the resin film 240 are precisely controlled. Hence, display devices having high reliability can be provided with the manufacturing method according to the present embodiment.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is understood that another effect different from that provided by each of the aforementioned embodiments is achieved by the present invention if the effect is obvious from the description in the specification or readily conceived by persons ordinarily skilled in the art.

What is claimed is:

1. A display device comprising:
    a display region;
    a periphery region surrounding the display region;
    a transistor located in the display region;
    a leveling film located over and covering the transistor;
    a display element located over the leveling film and electrically connected to the transistor;
    a dam located over the periphery region and surrounding the display region; and
    a guide located between the leveling film and the dam, surrounding the display region, and containing a first organic compound included in the leveling film,
    wherein the guide comprises a plurality of guide insulating films, and
    each of the plurality of guide insulating films is arranged so that an extended line of the longest side intersects an edge portion of the display region.

2. The display device according to claim 1, wherein the plurality of guide insulating films is spaced away from at least one of the dam and the leveling film.

3. The display device according to claim 1, wherein a height of the plurality of guide insulating films is smaller than a height of the dam.

4. The display device according to claim 1, further comprising a partition wall in the display region,
    wherein the display element includes a pixel electrode,
    the partition wall covers an edge portion of the pixel electrode, and
    the dam includes a first layer containing an organic compound and a second layer located over the first layer and containing a second organic compound contained in the partition wall.

5. The display device according to claim 1, wherein each of the plurality of guide insulating films is arranged so that the longest side is parallel to an edge portion of the display region closest to the longest side.

6. The display device according to claim 5, wherein the plurality of guide insulating films is staggered.

7. A display device comprising:
    a display region;
    a periphery region surrounding the display region;
    a transistor located in the display region;
    a leveling film located over and covering the transistor;
    a display element located over the leveling film and electrically connected to the transistor;
    a first dam located over the periphery region and surrounding the display region;
    a second dam located over the periphery region and surrounding the first dam; and
    a guide located at least between the leveling film and the first dam or between the first dam and the second dam and containing a first organic compound included in the leveling film,
    wherein the guide comprises a plurality of guide insulating films,
    the plurality of guide insulating films located between the leveling film and the first dam is spaced away from at least one of the first dam and the leveling film, and
    the plurality of guide insulating films located between the first dam and the second dam is spaced away from at least one of the first dam and the second dam.

8. The display device according to claim 7, wherein a height of the plurality of guide insulating films is smaller than a height of the first dam and a height of the second dam.

9. The display device according to claim 7, wherein each of the plurality of guide insulating films is arranged so that an extended line of the longest side intersects an edge portion of the display region.

10. The display device according to claim 7, further comprising a partition wall in the display region,
    wherein the display element includes a pixel electrode,
    the partition wall covers an edge portion of the pixel electrode, and
    the first dam and the second dam each include a first layer containing an organic compound and a second layer located over the first layer and containing a second organic compound contained in the partition wall.

11. The display device according to claim 9, wherein each of the plurality of guide insulating films is arranged so that the longest side is parallel to an edge portion of the display region closest to the longest side.

12. The display device according to claim 11, wherein the plurality of guide insulating films is staggered.

13. The display device according to claim 9,
    wherein the guide is located between the leveling film and the first dam and between the first dam and the second dam, and
    a first direction in which longest sides of the plurality of guide insulating films between the leveling film and the first dam is different from a second direction in which longest sides of the plurality of guide insulating films between the first dam and the second dam extend.

14. The display device according to claim 13,
    wherein an extended line of the first direction intersects an edge portion of the display region, and
    the second region is parallel to the edge portion of the display region closest from the longest sides.

15. A manufacturing method of a display device, the manufacturing method comprising:
    forming a transistor over a substrate;
    forming a first resin so as to cover the transistor;
    forming a leveling film, a guide surrounding the leveling film, and a dam surrounding the guide by processing the first resin; and
    forming a display element electrically connected to the transistor,
    wherein the guide includes a plurality of insulating films formed of the first resin, and processing the first resin includes:
    arranging, over the first resin, a photomask including a light-transmitting portion, a light-shielding portion, and a translucent portion so that a first region covered by the translucent portion is spaced away from the transistor and covers the transistor, and that a region covered by the light-shielding portion surrounds the first region;
    irradiating the first resin with light through the photomask; and
    developing the first resin.

* * * * *